(12) United States Patent
Yamamoto et al.

(10) Patent No.: US 9,029,438 B2
(45) Date of Patent: May 12, 2015

(54) THERMOSETTING RESIN COMPOSITION, B-STAGE HEAT CONDUCTIVE SHEET, AND POWER MODULE

(75) Inventors: Kei Yamamoto, Tokyo (JP); Takashi Nishimura, Tokyo (JP); Kenji Mimura, Tokyo (JP); Motoki Masaki, Tokyo (JP); Seiki Hiramatsu, Tokyo (JP); Xiaohong Yin, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 518 days.

(21) Appl. No.: 13/576,065

(22) PCT Filed: Dec. 28, 2010

(86) PCT No.: PCT/JP2010/073776
§ 371 (c)(1),
(2), (4) Date: Jul. 30, 2012

(87) PCT Pub. No.: WO2011/104996
PCT Pub. Date: Sep. 1, 2011

(65) Prior Publication Data
US 2013/0012621 A1   Jan. 10, 2013

(30) Foreign Application Priority Data

Feb. 23, 2010   (JP) .................................. 2010-037501

(51) Int. Cl.
| | | |
|---|---|---|
| *C08G 59/40* | (2006.01) | |
| *C08K 3/10* | (2006.01) | |
| *H01L 23/373* | (2006.01) | |
| *H01L 25/07* | (2006.01) | |
| *H01L 23/495* | (2006.01) | |
| *H01L 23/00* | (2006.01) | |

(52) U.S. Cl.
CPC .............. *C08K 3/10* (2013.01); *H01L 23/3737* (2013.01); *H01L 23/49568* (2013.01); *H01L 24/48* (2013.01); *H01L 25/072* (2013.01); *H01L 2224/48091* (2013.01); *H01L 2224/48137* (2013.01); *H01L 2224/48247* (2013.01); *H01L 2924/01004* (2013.01); *H01L 2924/10253* (2013.01); *H01L 2924/10272* (2013.01); *H01L 2924/1033* (2013.01); *H01L 2924/15159* (2013.01)

(58) Field of Classification Search
CPC ....................................................... C08L 63/00
USPC ........................................................... 523/445
See application file for complete search history.

(56) References Cited

U.S. PATENT DOCUMENTS

| | | | | |
|---|---|---|---|---|
| 4,784,978 A | * | 11/1988 | Ogasawara et al. ........... 501/96.4 |
| 5,389,851 A | * | 2/1995 | Kimura et al. ................. 310/340 |
| 5,531,945 A | * | 7/1996 | Ohya et al. ..................... 264/102 |
| 6,148,763 A | * | 11/2000 | Akiyama et al. .......... 118/723 E |
| 6,398,815 B1 | * | 6/2002 | Pope et al. .................... 623/23.6 |
| 6,645,612 B2 | * | 11/2003 | Pujari et al. ................... 428/325 |
| 6,676,704 B1 | * | 1/2004 | Pope et al. .................. 623/18.11 |
| 8,193,633 B2 | * | 6/2012 | Mimura et al. ............... 257/707 |
| 2002/0112408 A1 | * | 8/2002 | Rolander et al. ................ 51/307 |
| 2002/0132447 A1 | * | 9/2002 | Ohya et al. .................... 438/455 |
| 2002/0167118 A1 | * | 11/2002 | Billiet et al. .................. 264/432 |
| 2002/0173121 A1 | * | 11/2002 | Ohya et al. .................... 438/459 |
| 2003/0038278 A1 | | 2/2003 | Ishihara |
| 2003/0047802 A1 | * | 3/2003 | Hiramatsu et al. ............ 257/703 |
| 2004/0040216 A1 | | 3/2004 | Endoh et al. |
| 2005/0281726 A1 | * | 12/2005 | Paine, Jr. ....................... 423/277 |
| 2006/0042171 A1 | * | 3/2006 | Radtke et al. ................... 51/307 |
| 2006/0043652 A1 | * | 3/2006 | Saijo et al. .................... 264/671 |
| 2006/0121068 A1 | * | 6/2006 | Sane et al. ..................... 424/400 |
| 2006/0127422 A1 | * | 6/2006 | Lodyga et al. ................ 424/400 |
| 2010/0226095 A1 | | 9/2010 | Mimura et al. |
| 2011/0059310 A1 | * | 3/2011 | Wehrspohn et al. ........ 428/315.5 |
| 2012/0046387 A1 | * | 2/2012 | Chu et al. ...................... 523/351 |
| 2012/0058342 A1 | * | 3/2012 | Lodyga et al. ................ 428/403 |
| 2013/0052246 A1 | * | 2/2013 | Ito et al. ........................ 424/401 |
| 2013/0079229 A1 | * | 3/2013 | de Bock et al. ............... 505/162 |
| 2014/0349105 A1 | * | 11/2014 | Yamazaki et al. ............. 428/323 |

FOREIGN PATENT DOCUMENTS

| | | |
|---|---|---|
| DE | 11 2008 002 566 T5 | 7/2010 |
| EP | 1 286 394 A2 | 2/2003 |
| JP | 11 26661 | 1/1999 |
| JP | 2003 60134 | 2/2003 |
| JP | 2003 105324 | 4/2003 |
| JP | 2004 82323 | 3/2004 |
| JP | 2005 14190 | 1/2005 |
| JP | 2005 149770 | 7/2009 |
| JP | 2009 227947 | 10/2009 |
| WO | 2009 041300 | 4/2009 |

OTHER PUBLICATIONS

German Office Action issued Mar. 14, 2014 in Patent Application No. 11 2010 005 303.0 with English Translation.
Japanese Office Action Issued Apr. 17, 2012 in JP Patent Application 2009-227519 (with English translation).
International Search Report Isssued Feb. 22, 2011 in PCT/JP10/073776 Filed Dec. 28, 2010.

\* cited by examiner

*Primary Examiner* — Megan McCulley
(74) *Attorney, Agent, or Firm* — Oblon, McClelland, Maier & Neustadt, L.L.P.

(57) ABSTRACT

Provided is a thermosetting resin composition including an inorganic filler and a thermosetting resin matrix component, in which the inorganic filler includes secondary sintered particles each formed of primary particles of scaly boron nitride, and at least some of the secondary sintered particles each have a maximum cavity diameter of 5 μm to 80 μm. The thermosetting resin composition can be used for providing a heat conductive sheet in which electrical insulation property is kept by controlling where the defects such as voids and cracks occur and their size, and which has excellent heat conductivity.

18 Claims, 3 Drawing Sheets

US 9,029,438 B2

THERMOSETTING RESIN COMPOSITION, B-STAGE HEAT CONDUCTIVE SHEET, AND POWER MODULE

TECHNICAL FIELD

The present invention relates to a thermosetting resin composition, a B-stage heat conductive sheet, and a power module, and more particularly, to a thermosetting resin composition and a B-stage heat conductive sheet which are used for producing a heat conductive sheet for transferring heat from a heat generating member to a heat dissipating member in, for example, an electric/electronic instrument, and a power module including a heat conductive sheet produced from the thermosetting resin composition and the B-stage heat conductive sheet.

BACKGROUND ART

A member for transferring heat from a heat generating member to a heat dissipating member in an electric/electronic instrument must be excellent in both heat conductivity and electrical insulation property. A heat conductive sheet produced by blending an inorganic filler excellent in heat conductivity and electrical insulation property is widely used as a member satisfying the requirements mentioned above. Here, examples of an inorganic filler excellent in heat conductivity and electrical insulation property include alumina, boron nitride, silica, and aluminum nitride. In particular, hexagonal boron nitride (h-BN) is especially suitable for use in a heat conductive sheet, because hexagonal boron nitride is excellent in chemical stability in addition to heat conductivity and electrical insulation property, is non-toxic, and is relatively inexpensive. Hexagonal boron nitride has a scaly shape, and is also called scaly boron nitride in the art.

As a heat conductive sheet containing boron nitride, there is proposed a heat conductive sheet produced by dispersing, in a thermosetting resin matrix, secondary particles having isotropic heat conductivity, such as secondary aggregated particles formed by aggregating primary particles of scaly boron nitride or secondary sintered particles obtained by sintering the secondary aggregated particles (see, for example, Patent Documents 1 and 2). Such heat conductive sheet has increased heat conductivity in a thickness direction of the sheet by virtue of the secondary particles having isotropic heat conductivity.

Meanwhile, in recent years, with development of large-current electric/electronic instruments having high pressure resistance, the temperature of heat generated by various semiconductor devices has been increasing. Thus, in order to dissipate the heat of various semiconductor devices efficiently, heat conductivity of a heat conductive sheet is improved by increasing the blending amount of an inorganic filler. However, as the blending amount of an inorganic filler is increased in a heat conductive sheet, defects such as voids and cracks are liable to occur in the heat conductive sheet, resulting in deterioration of the electrical insulation property of the heat conductive sheet. Thus, a pressing step is performed at the time of manufacturing the heat conductive sheet, thereby suppressing occurrence of the defects in the heat conductive sheet. For example, in a power module including a heat conductive sheet, a pressing step is performed at the time of manufacturing a heat conductive sheet in a B-stage state (hereinafter, referred to as "B-stage heat conductive sheet") before being incorporated into the power module, thereby suppressing occurrence of defects in the B-stage heat conductive sheet. Further, when a B-stage heat conductive sheet is arranged between a lead frame mounted with semiconductor devices and a metal sheet and then, the whole is sealed with a sealing resin by performing transfer molding, thus producing a power module, molding pressure at the time of performing the transfer molding suppresses occurrence of defects in the heat conductive sheet.

CITATION LIST

Patent Documents

Patent Document 1: JP 2003-60134 A
Patent Document 2: WO 2009/041300 A1

DISCLOSURE OF THE INVENTION

Problems to be Solved by the Invention

However, when transfer molding is performed at the time of producing a power module, it takes a certain time until pressure is applied to a B-stage heat conductive sheet manufactured by applying pressure, and hence, in a high-temperature, pressureless state before the application of the pressure, the B-stage heat conductive sheet manufactured by applying pressure deforms and loosens (expands), resulting in occurrence of defects in the resultant heat conductive sheet. This is attributed to the occurrence of strain or residual stress in the B-stage heat conductive sheet manufactured by applying pressure. At this time, some of the defects occurring in the heat conductive sheet are liable to aggregate with each other to make a larger defect, and the larger defect deteriorates the electrical insulation property of the heat conductive sheet remarkably. Further, it is difficult to reduce the defects occurring in the heat conductive sheet even if molding pressure is applied at the time of performing transfer molding. Note that it is also probably possible to reduce the defects in the heat conductive sheet by increasing molding pressure at the time of performing transfer molding, but when secondary sintered particles are used in particular as an inorganic filler in a heat conductive sheet, too high molding pressure causes decay of the secondary sintered particles, resulting in deterioration of the heat conductivity of the heat conductive sheet.

The present invention has been made to solve the problems described above. An object of the present invention is to provide a thermosetting resin composition and a B-stage heat conductive sheet used for producing a heat conductive sheet in which the electrical insulation property is kept by controlling where the defects such as voids and cracks occur and their size, and which has excellent heat conductivity.

Another object of the present invention is to provide a power module excellent in electrical insulation and heat dissipation properties.

Means for Solving the Problems

The inventors of the present invention have made intensive studies to achieve the above-mentioned objects. As a result, the inventors have found that blending secondary sintered particles each having a cavity with a particular size in a heat conductive sheet, restricts the occurrence of defects attributed to deformation and loosening in each cavity of the secondary sintered particles and controls the size of the defects, and consequently, that large defects can be suppressed from occurring in a base portion (thermosetting resin matrix between inorganic filler particles) of the heat conductive sheet.

That is, the present invention relates to a thermosetting resin composition, including an inorganic filler and a thermosetting resin matrix component, in which the inorganic filler includes secondary sintered particles each formed of primary particles of scaly boron nitride; and where at least some of the secondary sintered particles each have a maximum cavity diameter of 5 μm to 80 μm.

The present invention also relates to a B-stage heat conductive sheet, including an inorganic filler dispersed in a thermosetting resin matrix in a B-stage state, in which the inorganic filler includes secondary sintered particles each formed of primary particles of scaly boron nitride; and where at least some of the secondary sintered particles each have a maximum cavity diameter of 5 μm to 80 μm.

The present invention also relates to a power module, including a heat conductive sheet including an inorganic filler dispersed in a thermosetting resin matrix, in which: the inorganic filler includes secondary sintered particles each formed of primary particles of scaly boron nitride; and where at least some of the secondary sintered particles each have a maximum cavity diameter of 5 μm to 80 μm.

Effects of the Invention

According to the present invention, it is possible to provide the thermosetting resin composition and the B-stage heat conductive sheet used for producing a heat conductive sheet in which electrical insulation property is kept by controlling where the defects such as voids and cracks occur and their size, and which has excellent heat conductivity.

Further, according to the present invention, it is possible to provide a power module excellent in electrical insulation and heat dissipation properties.

MODES FOR CARRYING OUT THE INVENTION

Embodiment 1

A thermosetting resin composition of this embodiment includes an inorganic filler and a thermosetting resin matrix component.

The inorganic filler to be used for the thermosetting resin composition of this embodiment includes secondary sintered particles formed of primary particles of scaly boron nitride. The phrase "secondary sintered particle" as used herein means a particle produced by aggregating primary particles of scaly boron nitride, followed by sintering and is generally known in the art. However, whereas each general secondary sintered particle has a small cavity (specifically, a cavity having a maximum cavity diameter of less than 0.5 μm) formed between primary particles of scaly boron nitride, at least some of the secondary sintered particles to be used for the thermosetting resin composition of this embodiment each have a cavity having a maximum cavity diameter of 5 μm to 80 μm. The thermosetting resin composition of this embodiment has blended therein secondary sintered particles each having such maximum cavity diameter, and hence the occurrence site and size of defects in the resultant heat conductive sheet can be properly controlled. If the maximum cavity diameter is less than 5 μm, the occurrence of defects in the base portion of the resultant heat conductive sheet cannot be suppressed, resulting in the deterioration of the electrical insulation property of the heat conductive sheet. On the other hand, if the maximum cavity diameter is more than 80 μm, the occurrence of defects in the base portion of the resultant heat conductive sheet can be suppressed, but a defect occurring in the cavity of each of the secondary sintered particles becomes too large, resulting in the deterioration of the electrical insulation property of the heat conductive sheet.

The phrase "maximum cavity diameter of secondary sintered particles" as used herein means a value obtained by actually manufacturing a heat conductive sheet in which secondary sintered particles are dispersed in a thermosetting resin matrix, polishing a cross-section of this heat conductive sheet, magnifying an image of the polished cross-section with a magnification of several thousand times with an electron microscope, taking several photographs of the image, and then actually measuring the maximum diameter of the cavity of each secondary sintered particle.

Hereinafter, secondary sintered particles each having a cavity having a maximum cavity diameter of less than 0.5 μm are referred to as "solid secondary sintered particles," secondary sintered particles each having a cavity having a maximum cavity diameter of 0.5 μm or more are referred to as "hollow secondary sintered particles," and both the solid secondary sintered particles and the hollow secondary sintered particles are referred to as "secondary sintered particles."

Figure 1:
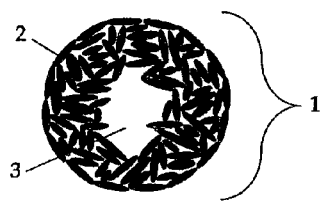
FIG. 1 A cross-sectional view of a secondary sintered particle having a maximum cavity diameter of 5 μm to 80 μm.

Here, FIG. 1 illustrates a cross-sectional view of a hollow secondary sintered particle. As illustrated in FIG. 1, a hollow secondary sintered particle 1 has a large cavity 3 formed between primary particles 2 of scaly boron nitride.

The maximum cavity diameter of the hollow secondary sintered particle 1 is preferably two thirds or less of the average particle diameter of each of the hollow secondary sintered particles 1. If the maximum cavity diameter of the hollow secondary sintered particle 1 is more than two thirds of the average particle diameter of each of the hollow secondary sintered particles 1, the thickness of the shell part around the large cavity 3 becomes too thin, and consequently, the large cavity 3 sometimes cannot keep its shape at the time of a pressing step (for example, applying pressure at the time of manufacturing a B-stage heat conductive sheet or applying transfer molding pressure at the time of manufacturing a power module).

The large cavity 3 in the hollow secondary sintered particle 1 is larger in comparison to a defect occurring in the base portion of a heat conductive sheet at the time of manufacturing a power module. If the hollow secondary sintered particle 1 having such large cavity 3 is blended in a thermosetting resin composition, when a B-stage heat conductive sheet produced from the thermosetting resin composition is exposed to high temperature under a pressureless state at the time of manufacturing a power module, the B-stage heat conductive sheet deforms and loosens and its thermosetting resin matrix melts and flows as well. Then, expansion attributed to the deformation and loosening causes the thermosetting resin matrix to flow out from the inside of the hollow secondary sintered particle 1 having a small capillary force, thereby preventing the occurrence of defects in the base portion of the heat conductive sheet.

In this context, a capillary action which occurs when a B-stage heat conductive sheet is exposed to high temperature under a pressureless state and its thermosetting resin matrix melts and flows can be, in general, represented by the following equation (1).

$$h = 2T \cos \theta / \varrho gr \quad (1)$$

In the equation (1), h represents the ease (m) of outflow of a thermosetting resin matrix, T represents a surface tension (N/m), $\theta$ represents a contact angle (°), $\varrho$ represents the density (kg/m$^3$) of the thermosetting resin matrix, g represents a gravity acceleration (m/m$^2$), and r represents the diameter of a defect occurring in the base portion of a heat conductive sheet and the maximum cavity diameter (m) of the hollow secondary sintered particle 1.

As seen from the equation (1), it can be said that the ease of outflow of a thermosetting resin matrix when the thermosetting resin matrix melts is related to both the diameter of a defect occurring in the base portion of a heat conductive sheet and the maximum cavity diameter of the hollow secondary sintered particle 1, and as these diameters become smaller, the capillary force becomes larger. That is, the flowability of a molten thermosetting resin matrix can be controlled by setting the maximum cavity diameter of the hollow secondary sintered particle 1 to a diameter larger than the diameter of a defect occurring in the base portion of a heat conductive sheet.

Figure 2:
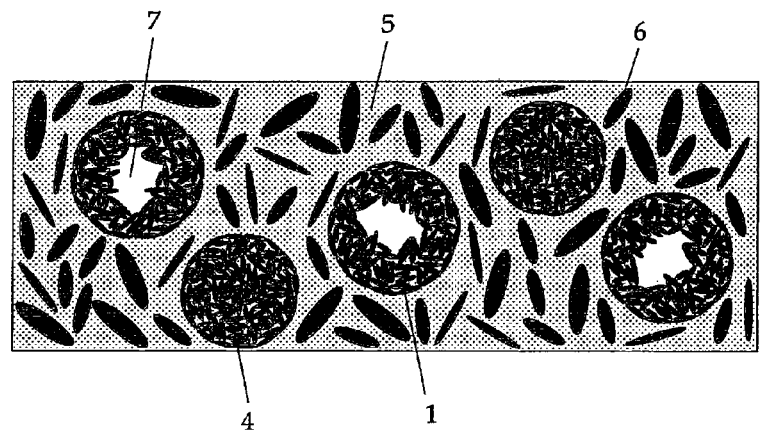
FIG. 2 A cross-sectional view of a heat conductive sheet produced from a thermosetting resin composition of Embodiment 1.

Next, FIG. 2 illustrates a cross-sectional view of a heat conductive sheet produced from the thermosetting resin composition of this embodiment. In FIG. 2, the heat conductive sheet includes a thermosetting resin matrix 5, and secondary sintered particles (hollow secondary sintered particles 1 and solid secondary sintered particles 4) dispersed in the thermosetting resin matrix 5, and optionally primary particles 6 of scaly boron nitride to be described below. In this heat conductive sheet, a defect 7 is caused to occur in the large cavity 3 in each of the hollow secondary sintered particles 1 and the size of the defect 7 is controlled. As a result, it is possible to suppress defects from occurring in the base portion (thermosetting resin matrix 5 portion between particles of an inorganic filler) of the heat conductive sheet.

Figure 3:
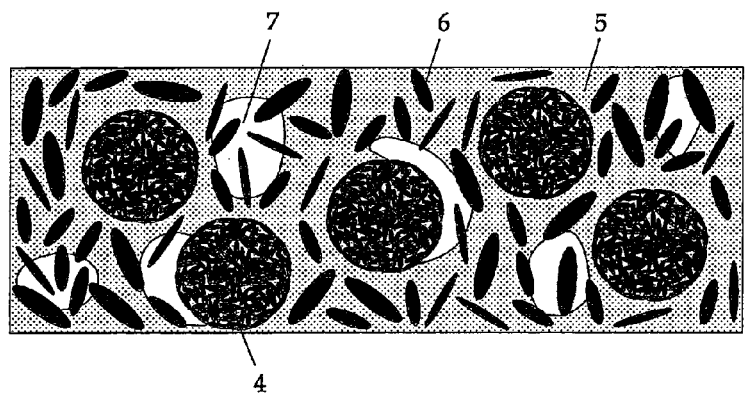
FIG. 3 A cross-sectional view of a heat conductive sheet produced from a thermosetting resin composition free of hollow secondary sintered particles.

On the other hand, FIG. 3 illustrates a cross-sectional view of a heat conductive sheet produced from a thermosetting resin composition free of the hollow secondary sintered particles 1. In FIG. 3, the heat conductive sheet includes the thermosetting resin matrix 5, the solid secondary sintered particles 4 dispersed in the thermosetting resin matrix 5, and optionally primary particles 6 of scaly boron nitride to be described below. In this heat conductive sheet, it is not possible to control the occurrence of cavities in the base portion (thermosetting resin matrix 5 portion between particles of an inorganic filler), and hence large defects 7 occur and the electrical insulation property deteriorates.

That is, when transfer molding is performed at the time of producing a power module, it takes a certain time until pressure is applied to a B-stage heat conductive sheet, and hence, under a high-temperature, pressureless state before the application of the pressure, the B-stage heat conductive sheet manufactured by applying pressure deforms and loosens (expands) and the thermosetting resin matrix 5 melts and flows as well, resulting in the occurrence of the defects 7 in the resultant heat conductive sheet. However, when a B-stage heat conductive sheet manufactured from the thermosetting resin composition of this embodiment having blended therein the predetermined hollow secondary sintered particles 1 is used, the defects 7 can be caused to occur only in the large cavity 3 of each of the hollow secondary sintered particles 1 and the size of each of the defects 7 can be controlled, thereby allowing the occurrence of the defects 7 in the base portion of the heat conductive sheet to be suppressed. As a result, the electrical insulation property of the heat conductive sheet can be prevented from deteriorating.

The average length of each of the primary particles 2 of scaly boron nitride constituting each secondary sintered particle is preferably 15 µm or less, more preferably 0.1 µm to 8 µm. The phrase "average length of each of the primary particles 2 of scaly boron nitride" as used herein means a value obtained by actually manufacturing a heat conductive sheet in which secondary sintered particles are dispersed in the thermosetting resin matrix 5, polishing a cross-section of this heat conductive sheet, magnifying an image of the polished cross-section with a magnification of several thousand times with an electron microscope, taking several photographs of the image, then actually measuring the length of each primary particle, and averaging the measured values. If the average length of each of the primary particles 2 of scaly boron nitride is more than 15 µm, the primary particles 2 of scaly boron nitride may not aggregate isotropically, possibly resulting in the occurrence of anisotropy in the heat conductivity of each of the resultant secondary sintered particles. As a result, a heat conductive sheet having the desired heat conductivity is not provided in some cases.

The average particle diameter of each of the secondary sintered particles is preferably 20 µm to 180 µm, more preferably 40 µm to 130 µm. The phrase "average particle diameter of each of the secondary sintered particles" as used herein means a value obtained by actually manufacturing a heat conductive sheet in which the secondary sintered particles are dispersed in the thermosetting resin matrix 5, polishing a cross-section of this heat conductive sheet, magnifying an image of the polished cross-section with a magnification of several thousand times with an electron microscope, taking several photographs of the image, then actually measuring the particle diameter of each secondary sintered particle, and averaging the measured values. Alternatively, after a heat conductive sheet in which the secondary sintered particles are dispersed in the thermosetting resin matrix 5 is actually manufactured, the heat conductive sheet is subjected to heat treatment at a temperature of 500° C. to 800° C. in an air atmosphere for about 5 to 10 hours in an electric furnace to cause incineration, and the resultant secondary sintered particles are subjected to particle-size distribution measurement using a laser diffraction/scattering method to measure their particle diameters, followed by calculation of the average value of the particle diameters. The average value may be defined as the "average particle diameter of each of the secondary sintered particles." If the average particle diameter of each of the secondary sintered particles is less than 20 µm, a heat conductive sheet having the desired heat conductivity is not provided in some cases. On the other hand, if the average particle diameter of each of the secondary sintered particles is more than 180 µm, it becomes difficult to knead and disperse the secondary sintered particles in a thermosetting resin composition, with the result that the workability and formability of the thermosetting resin composition may be affected adversely. Further, a heat conductive sheet having the desired thickness may not be provided and the electrical insulation property of the heat conductive sheet may deteriorate.

Further, if the maximum particle diameter of each of the secondary sintered particles is too large with respect to the thickness of the heat conductive sheet, an electric current flows through an interface, possibly resulting in the deterioration of the electrical insulation property of the heat conductive sheet. Thus, the maximum particle diameter of the secondary sintered particles is preferably about 90% or less of the thickness of the heat conductive sheet.

Note that the shape of each of the secondary sintered particles is not limited to a spherical shape and may be any other shape such as a scaly shape. Note that in the case of any other shape than a spherical shape, the average diameter of each of the secondary sintered particles means the length of the long side of the other shape. Further, when secondary sintered particles each having a spherical shape are used, the blending amount of the secondary sintered particles can be increased while the flowability of a thermosetting resin matrix component is maintained at the time of producing a thermosetting resin composition. Hence, the secondary sintered particles each preferably have a spherical shape.

The secondary sintered particles can be produced by using the primary particles 2 of scaly boron nitride and following a known method. Specifically, the secondary sintered particles can be produced by aggregating the primary particles 2 of scaly boron nitride by a known method and then sintering the resultant. Here, the temperature of the sintering is not particularly limited and is about 2,000° C. in general. The method for the aggregation is not particularly limited. Preferred is a spray dry method in which the primary particles 2 of scaly boron nitride, a water-soluble binder, and water are homogeneously mixed, yielding a slurry, the slurry is sprayed from above, and drying and granulation are performed while droplets of the slurry are falling. The spray dry method is often used for mass production, because spherical granules with good flowability (secondary aggregated particles) can be easily produced. The size of the cavity in each secondary aggregated particle produced by the spray dry method can be controlled by adjusting the concentration of the slurry. In the spray dry method, drying is performed while droplets of a slurry are falling, and hence, when the concentration of the primary particles 2 of scaly boron nitride is kept low in the slurry, the amount of deformation of the droplets into dried secondary aggregated particles becomes large, thus yielding hollow secondary aggregated particles. In contrast, when the concentration of the primary particles 2 of scaly boron nitride is kept high in the slurry, the amount of deformation of droplets of the slurry into dried secondary aggregated particles becomes small, thus yielding solid secondary aggregated particles.

Specifically, the solid secondary aggregated particles can be manufactured by spray-drying a slurry containing 30 parts by mass to 120 parts by mass of water with respect to 100 parts by mass of the primary particles 2 of scaly boron nitride. If the content of water in the slurry is smaller than that in the above range, the slurry has higher viscosity and lower flowability, and there is sometimes the disadvantage that the spray dryer becomes clogged at the time of spraying, resulting in being unable to perform a continuous operation. If the content of water in the slurry is larger than that in the above range, the hollow secondary aggregated particles are formed at a high ratio. On the other hand, the hollow secondary aggregated particles can be manufactured by spray-drying a slurry containing 150 parts by mass to 300 parts by mass of water with respect to 100 parts by mass of the primary particles 2 of scaly boron nitride. If the content of water in the slurry is smaller than that in the above range, the solid secondary aggregated particles are formed at a high ratio.

The hollow secondary aggregated particles and solid secondary aggregated particles formed as described above can be sintered to yield the hollow secondary sintered particles 1 and the solid secondary sintered particles 4, respectively.

The inorganic filler to be used for the thermosetting resin composition of this embodiment may further include the primary particles 6 of scaly boron nitride in addition to the primary particles 2 of scaly boron nitride constituting each secondary sintered particle, from the viewpoint of improving the heat conductivity of the heat conductive sheet. The average length of each of the primary particles 6 of scaly boron nitride is preferably 3 μm to 50 μm. When the primary particles 6 of scaly boron nitride having an average length in such a range are blended, the primary particles 6 of scaly boron nitride are filled between secondary sintered particles with balance in the resultant heat conductive sheet, and hence the heat conductivity of the heat conductive sheet can be enhanced. Particularly when the primary particles 6 of scaly boron nitride each have an average length of 5 μm to 20 μm, the filling ratio of the primary particles 6 of scaly boron nitride in the heat conductive sheet can be increased, and hence the heat conductivity of the heat conductive sheet can be further enhanced. If the primary particles 6 of scaly boron nitride each have an average length of less than 3 μm, the filling amount of the primary particles 6 of scaly boron nitride needs to be increased in order to improve the heat conductivity of the heat conductive sheet. As a result, the specific surface areas of the primary particles 6 of scaly boron nitride become larger, resulting in the increase of the area of the interface between the thermosetting resin matrix 5 and each of the primary particles 6 of scaly boron nitride, the interface being a portion having high thermal resistance, and hence, when a heat conductive sheet is manufactured, desired heat conductivity is not provided to the heat conductive sheet in some cases. On the other hand, if such average length is more than 50 μm, the size of the primary particles 6 is too large, and the primary particles 6 of scaly boron nitride are not easily filled between secondary sintered particles properly in some cases.

The inorganic filler to be used for the thermosetting resin composition of this embodiment may additionally include known inorganic powder as long as the effects of the present invention are not impaired, from the viewpoint of improving the heat conductivity and electrical insulation property of a heat conductive sheet and striking a balance between the heat conductivity and the electrical insulation property. Examples of the known inorganic powder may include molten silica ($SiO_2$), crystalline silica ($SiO_2$), aluminum oxide ($Al_2O_3$), aluminum nitride (AlN), and silicon carbide (SiC). One of them may be used alone or two or more kinds thereof may be used in combination.

The content of the inorganic filler in the thermosetting resin composition of this embodiment is controlled so that the content of the inorganic filler in a heat conductive sheet (the solid content of the thermosetting resin composition) is preferably 30 volume % or more, more preferably 40 volume % to 80 volume %. If the content of the inorganic filler is less than 30 volume %, the content of the inorganic filler is too small, and a heat conductive sheet having the desired heat conductivity is not provided in some cases. The content of the hollow secondary sintered particles 1 of the inorganic filler in the thermosetting resin composition of this embodiment is controlled so that the content of the hollow secondary sintered particles 1 in a heat conductive sheet (the solid content of the thermosetting resin composition) is preferably 3 volume % or more, more preferably 5 volume % to 20 volume %. If the content of the hollow secondary sintered particles 1 is less than 5 volume %, the content of the hollow secondary sintered particles 1 is too small, and hence an effect of suppressing the occurrence of defects in the base portion of the heat conductive sheet is not sufficiently exerted in some cases.

The thermosetting resin matrix component to be used for the thermosetting resin composition of this embodiment is a component constituting the thermosetting resin matrix 5 serving as a base (base material) of a heat conductive sheet. The thermosetting resin matrix component generally includes a thermosetting resin and a curing agent.

The thermosetting resin is not particularly limited and one known in the art can be used. Examples of the thermosetting resin include epoxy resins, unsaturated polyester resins, phenol resins, melamine resins, silicone resins, and polyimide resins.

Further, it is preferred to use a thermosetting resin that provides a thermosetting resin matrix 5 excellent in heat resistance, from the viewpoint of providing a heat conductive sheet excellent in heat resistance. Specifically, it is preferred to use a thermosetting resin that provides a thermosetting resin matrix 5 which does not lose its intrinsic physical properties even when being exposed to a temperature of 180° C. to 250° C. Examples of such thermosetting resin include heat-resistant epoxy resins. It is desirable to use a heat-resistant epoxy resin which has two or more epoxy groups per molecule and has an epoxy equivalent in the range of preferably 100 to 1,000, more preferably 150 to 500.

Preferred examples of the heat-resistant epoxy resin include glycidyl ether-based epoxy resins of polyphenol compounds such as bisphenol A, 2,2-bis(4-hydroxyphenylbutane) (bisphenol B), 1,1'-bis(4-hydroxyphenyl)ethane, bis(4-hydroxyphenyl)methane (bisphenol F), 1,1,2,2-tetrakis(4-hydroxyphenyl)ethane, 4-hydroxyphenyl ether, and p-(4-hydroxy)phenol, that is, diglycidyl ether bisphenol-type epoxy resins; a dicyclopentadiene-type epoxy resin; a naphthalene-type epoxy resin; a biphenyl-type epoxy resin; an anthracene-type epoxy resin; novolac-type epoxy resins such as a phenol novolac-type epoxy resin and a cresol novolac-type epoxy resin; a glycidylamine-type epoxy resin; a triphenolmethane-type epoxy resin; and a methylepichloro-type epoxy resin. These heat-resistant epoxy resins are commonly commercially available, and it is possible to use, for example, EPICRON EXA-4710 marketed by DIC Corporation or JER YX4000 marketed by Japan Epoxy Resins Co., Ltd. One of these heat-resistant epoxy resins may be used alone or two or more kinds thereof may be used in combination. These heat-resistant epoxy resins are generally solid at normal temperature, and hence it is preferred that the heat-resistant epoxy resins be used after being dissolved in an epoxy resin liquid at normal temperature, in consideration of the handling ease (in particular, handling ease in a semi-cure state) of a thermosetting resin composition. The phase "normal temperature" as used herein generally means a temperature of 25° C. (the phase "normal temperature" hereinafter has the same meaning).

The epoxy resin which is liquid at normal temperature is not particularly limited and one known in the art can be used. It is desirable to use a liquid epoxy resin which has two or more epoxy groups per molecule. Preferred examples of the liquid epoxy resin include bisphenol-type epoxy resins such as a bisphenol A-type epoxy resin and a bisphenol F-type epoxy resin, a cresol novolac-type epoxy resin such as an o-cresol novolac-type epoxy resin, and an alicyclic epoxy resin. Such liquid epoxy resins are commonly commercially available, and it is possible to use, for example, JER 828 marketed by Japan Epoxy Resins Co., Ltd. or CELLOXIDE 2021P marketed by Daicel Chemical Industries, Ltd. One of these liquid epoxy resins may be used alone or two or more kinds thereof may be used in combination.

The mass ratio of the heat-resistant epoxy resin (solid epoxy resin) to the liquid epoxy resin is recommended to be suitably adjusted depending on the kinds of epoxy resins used, is not particularly limited, and is generally 10:90 to 90:10, preferably 30:70 to 70:30.

The curing agent is not particularly limited and a known one is recommended to be suitably selected depending on the kind of thermosetting resin used. In particular, when an epoxy resin is used as the thermosetting resin, examples of the curing agent include: alicyclic acid anhydrides such as methyltetrahydrophthalic anhydride, methylhexahydrophthalic anhydride, and Himic anhydride; aliphatic acid anhydrides such as dodecenyl succinic anhydride; aromatic acid anhydrides such as phthalic anhydride and trimellitic anhydride; organic dihydrazides such as dicyandiamide and adipic acid dihydrazide; tris(dimethylaminomethyl)phenol; dimethylbenzylamine; 1,8-diazabicyclo(5,4,0)undecene and derivatives thereof; imidazoles such as 2-methylimidazole, 2-ethyl-4-methylimidazole, and 2-phenylimidazole; and phenol resins such as phenol novolac, o-cresol novolac, p-cresol novolac, t-butylphenol novolac, dicyclopentadienecresol, polyparavinylphenol, bisphenol A-type novolac, xylylene-modified novolac, decaline-modified novolac, poly(di-o-hydroxyphenyl)methane, poly(di-m-hydroxyphenyl)methane, and poly(di-p-hydroxyphenyl)methane. These may be used alone or in combination of two or more kinds thereof.

The blending amount of the curing agent in the thermosetting resin composition is recommended to be suitably adjusted depending on the kind of thermosetting resin used, the kind of curing agent used, and the like, and is generally 0.1 part by mass to 200 parts by mass with respect to 100 parts by mass of the thermosetting resin.

The primary particles 2 of scaly boron nitride constituting each secondary sintered particle do not have, on their surfaces, a functional group that can react with the thermosetting resin matrix component, and hence the adhesiveness between the thermosetting resin matrix 5 and each secondary sintered particle is sometimes insufficient. Further, the thermosetting resin matrix 5, which is excellent in heat resistance, is hard and fragile, and when the blending amount of the inorganic filler such as the secondary sintered particles is increased for the purpose of enhancing the heat conductivity of a heat conductive sheet, the heat conductive sheet often becomes fragile. Actually, when a thermosetting resin composition using a heat-resistant epoxy resin that provides the thermosetting resin matrix 5, which is excellent in heat resistance, is used to produce a heat conductive sheet (for example, at the time of coating with the thermosetting resin composition or at the time of forming into an dried coated film), cracking or chipping is liable to occur, and the handling ease of the thermosetting resin composition is not satisfactory in some cases.

Thus, in order to solve the above-mentioned problems, the thermosetting resin composition of this embodiment preferably includes a particular adhesiveness-imparting agent at a particular ratio. By blending the adhesiveness-imparting agent, it becomes possible to cause the thermosetting resin matrix component together with the adhesiveness-imparting agent to penetrate easily into the cavity of each secondary sintered particle, and to produce a heat conductive sheet in which the adhesiveness between the thermosetting resin matrix 5 and each secondary sintered particle is enhanced, without deteriorating the handling ease of the thermosetting resin composition.

Figure 4:
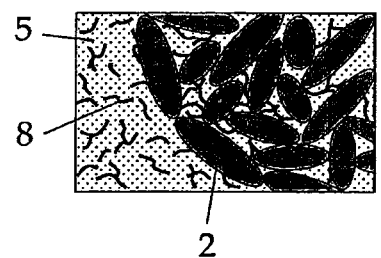
FIG. 4 An enlarged cross-sectional view of a heat conductive sheet produced from a thermosetting resin composition containing an adhesiveness-imparting agent.
Figure 5:
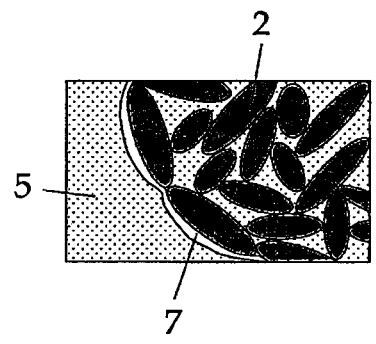
FIG. 5 An enlarged cross-sectional view of a heat conductive sheet produced from a thermosetting resin composition free of an adhesiveness-imparting agent.

Here, FIG. 4 illustrates an enlarged cross-sectional view of a heat conductive sheet produced from a thermosetting resin composition containing an adhesiveness-imparting agent. As illustrated in FIG. 4, an adhesiveness-imparting agent 8 penetrates into the cavity of a secondary sintered particle, thus improving the adhesiveness of the interface between the thermosetting resin matrix 5 and each of the primary particles 2 of scaly boron nitride constituting the secondary sintered particle. As a result, cracking and peeling at the interface between the thermosetting resin matrix 5 and the secondary sintered particle are suppressed, leading to the improvement of the heat conductivity and electrical insulation property of the heat conductive sheet. On the other hand, FIG. 5 illustrates an enlarged cross-sectional view of a heat conductive sheet produced from a thermosetting resin composition free of the adhesiveness-imparting agent 7. In this heat conductive sheet, as illustrated in FIG. 5, defects 7 occur at the interface between the thermosetting resin matrix 5 and the secondary sintered particle. The defects 7 cause the cracking and peeling of the sheet, resulting in the deterioration of the heat conductivity and electrical insulation property of the heat conductive sheet.

The adhesiveness-imparting agent 8 is a flexible resin having a weight-average molecular weight of 600 to 70,000, preferably 600 to 60,000 and having a glass transition temperature of 130° C. or less, preferably 100° C. or less. If a flexible resin having a weight-average molecular weight of less than 600 is blended, an effect of improving the adhesiveness between the thermosetting resin matrix 5 and each secondary sintered particle is not satisfactorily exerted. On the other hand, if the flexible resin has a weight-average molecular weight of more than 70,000, the flexible resin has a higher viscosity, and hence it is difficult for the flexible resin to penetrate into the cavity of each secondary sintered particle. As a result, the effect of improving the adhesiveness between the thermosetting resin matrix 5 and each secondary sintered particle is not satisfactorily exerted. Further, in a case where a flexible resin having a glass transition temperature of more than 130° C. is blended, it is also difficult for the flexible resin to penetrate into the cavity of each secondary sintered particle, and hence the effect of improving the adhesiveness between the thermosetting resin matrix 5 and each secondary sintered particle is not satisfactorily exerted.

Examples of the flexible resin include polyvinyl alcohol, acrylic resins, polyvinylbutyral, phenoxy resins, bisphenol-type epoxy resins, styrene-based polymers, silicone rubbers, styrene-butadiene rubbers, butadiene rubbers, isoprene rubbers, nitrile rubbers, butyl rubbers, and acrylic rubbers. These may be used alone or in combination of two or more kinds thereof. Among these flexible resins, from the viewpoint of the effect of improving the adhesiveness between the thermosetting resin matrix 5 and each secondary sintered particle, a bisphenol-type epoxy resin and a styrene-based polymer are preferred.

The bisphenol-type epoxy resin refers to an epoxy resin obtained by a reaction between a bisphenol such as bisphenol A or bisphenol F and epichlorohydrin or the like, and examples thereof include bisphenol A-type epoxy resins, bisphenol F-type epoxy resins, and bisphenol A/F-type epoxy resins. Of the bisphenol-type epoxy resins, a bisphenol-type epoxy resin represented by the following general formula (1) is particularly preferred.

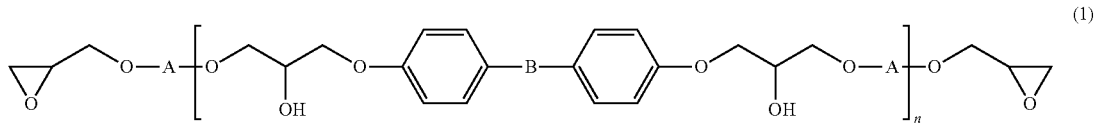

(1)

In the formula (1), A represents an aliphatic hydrocarbon, a bisphenol A-type skeleton, a bisphenol F-type skeleton, a bisphenol A/F mixed-type skeleton, a naphthalene skeleton, a biphenyl skeleton, a dicyclopentadiene skeleton, or

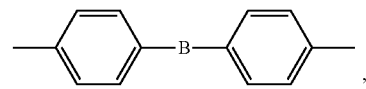

, preferably a bisphenol A-type skeleton, a bisphenol F-type skeleton, or a bisphenol A/F mixed-type skeleton, B represents $CH_2$, $CH(CH_3)$, or $C(CH_3)_2$, and n represents 0 to 10, preferably 1 to 8. Herein, the bisphenol A/F mixed-type skeleton means a skeleton having both a bisphenol A-type skeleton and a bisphenol F-type skeleton.

Bisphenol-type epoxy resins each represented by the general formula (1) are commonly commercially available, and it is possible to use, for example, JER E1256, E4250, or E4275 marketed by Japan Epoxy Resins Co., Ltd.

Further, a bisphenol-type epoxy resin in which a modification such as an alkylene oxide modification is made may be used. The phrase "alkylene oxide-modified bisphenol-type epoxy resin" refers to a bisphenol-type epoxy resin in which one or more alkylene oxide groups are bonded to an oxygen atom directly bonded to an aromatic ring which constitutes the bisphenol-type epoxy resin. In the alkylene oxide-modified bisphenol-type epoxy resin, each alkylene oxide group preferably includes two or more repeating units. Further, the alkylene oxide groups preferably link all aromatic rings in one molecule, and each alkylene oxide group may be directly bonded to an oxygen atom directly bonded to each aromatic ring or may be bonded to the oxygen atom through, for example, an acetal linkage. Examples of the alkylene oxide group include an ethyleneoxyethyl group, a propyleneoxypropyl group, a poly(ethyleneoxy)ethyl group, a poly(propyleneoxy)propyl group, and a group obtained by addition polymerization between ethylene oxide and propylene oxide.

An alkylene oxide-modified bisphenol-type epoxy resin particularly preferred in the present invention is an epoxy resin obtained by a reaction between an alkylene oxide-modified bisphenol such as an alkylene oxide-modified bisphenol A or an alkylene oxide-modified bisphenol F and chlorohydrin or the like, which is represented by the following general formula (2).

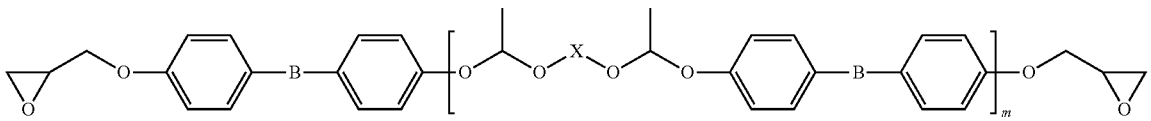

(2)

In the formula (2), B represents $CH_2$, $CH(CH_3)$, or $C(CH_3)_2$, X represents an ethyleneoxyethyl group, a di(ethyleneoxy)ethyl group, a tri(ethyleneoxy)ethyl group, a tetra(ethyleneoxy)ethyl group, a propyleneoxypropyl group, a di(propyleneoxy)propyl group, a tri(propyleneoxy)propyl group, a tetra(propyleneoxy)propyl group, a butyleneoxybutyl group, a di(butyleneoxy)butyl group, a tri(butyleneoxy)butyl group, a tetra(butyleneoxy)butyl group, an alkylene group having 2 to 15 carbon atoms, or an aliphatic hydrocarbon group having a cycloalkane skeleton and 6 to 17 carbon atoms, and m represents 0 to 20, preferably 2 to 5.

Alkylene oxide-modified bisphenol-type epoxy resins each represented by the general formula (2) are commonly commercially available. It is possible to use, for example, YL7175-500 or YL7175-1000 marketed by Japan Epoxy Resins Co., Ltd., or EPICLON EXA4850, 4816, or 4822 marketed by DIC Corporation.

The styrene-based polymer refers to a polymer having a styrene unit in a molecular chain, and examples thereof include polystyrene, styrene-methyl methacrylate copolymers, acrylonitrile-styrene copolymers, maleic anhydride-styrene copolymers, maleimide-styrene copolymers, and acrylonitrile-butadiene-styrene.

Among the styrene-based polymers, styrene-based polymers each having an epoxy group are preferred. Such styrene-based polymers are commonly commercially available, and it is possible to use, for example, Marproof (trademark) G-0115S, G-0250S, or G-1005SA marketed by NOF CORPORATION.

The blending amount of the adhesiveness-imparting agent 8 is in the range of 5 parts by mass to 30 parts by mass, preferably 5 parts by mass to 20 parts by mass, with respect to 100 parts by mass of the thermosetting resin matrix component. If the blending amount of the adhesiveness-imparting agent 8 is less than 5 parts by mass, the amount of the adhesiveness-imparting agent 8 is too small, and the effect of improving the adhesiveness between the thermosetting resin matrix 5 and each secondary sintered particle is not satisfactorily exerted. On the other hand, if the blending amount of the adhesiveness-imparting agent 8 is more than 30 parts by mass, the viscosity of the resultant thermosetting resin composition becomes higher, with the result that, when a heat conductive sheet is manufactured, defects such as voids occur in the sheet, resulting in the deterioration of the electrical insulation property of the heat conductive sheet.

The thermosetting resin composition of this embodiment may include a coupling agent from the viewpoint of improving an adhesive force at the interface between the thermosetting resin matrix 5 and the inorganic filler. The coupling agent is not particularly limited and one known in the art can be used. Examples of the coupling agent include γ-glycidoxypropyltrimethoxysilane, N-β(aminoethyl)γ-aminopropyltriethoxysilane, N-phenyl-γ-aminopropyltrimethoxysilane, and γ-mercaptopropyltrimethoxysilane. These coupling agents may be used alone or in combination of two or more kinds thereof.

The blending amount of the coupling agent is recommended to be set suitably depending on the kind of thermosetting resin used and the kind of coupling agent used, and is, in general, 0.01 part by mass to 5 parts by mass with respect to 100 parts by mass of the thermosetting resin.

The thermosetting resin composition of this embodiment may further include a solvent from the viewpoint of adjusting the viscosity of the composition. The solvent is not particularly limited and a known solvent is recommended to be suitably selected depending on the kind of thermosetting resin used and the kind of inorganic filler used. Examples of the solvent include toluene and methyl ethyl ketone. One of them may be used alone or two or more kinds thereof may be used in combination.

The blending amount of the solvent in the thermosetting resin composition is not particularly limited as long as kneading can be performed, and is, in general, 40 parts by mass to 300 parts by mass with respect to 100 parts by mass in total of the thermosetting resin and the inorganic filler.

A production method for the thermosetting resin composition of this embodiment, the composition containing such constituent components as described above, is not particularly limited, and the production can be performed according to known methods. The thermosetting resin composition of this embodiment can be produced in, for example, the following manner.

First, a predetermined amount of a thermosetting resin, a curing agent in an amount necessary for curing the thermosetting resin, and, if required, a predetermined amount of the adhesiveness-imparting agent 8 are mixed.

Next, a solvent is added to the mixture and an inorganic filler such as secondary sintered particles is then added to premix the whole. Note that, when the viscosity of the mixture is low, the solvent need not be added.

Subsequently, the premixture is kneaded by using a triple roll mill or a kneader, thereby being able to produce a thermosetting resin composition. Note that, when a coupling agent is blended in the thermosetting resin composition, the coupling agent only needs to be added before the kneading step.

In the thermosetting resin composition of this embodiment produced as described above has blended therein the hollow secondary sintered particles 1, and hence, when a power module is manufactured, a defect can be made to occur only in the large cavity 3 in each of the hollow secondary sintered particles 1 and the size of the defect can be controlled, thus allowing suppression of the occurrence of defects in the base portion of the heat conductive sheet. That is, the thermosetting resin composition can be used for producing a heat conductive sheet in which the electrical insulation property is kept by controlling where the defects such as voids and cracks occur and their size, and which has excellent heat conductivity.

Embodiment 2

A B-stage heat conductive sheet of this embodiment is produced by forming the above-mentioned thermosetting resin composition into a sheet and semi-curing the sheet. That is, the B-stage heat conductive sheet of this embodiment is a B-stage heat conductive sheet including an inorganic filler dispersed in a thermosetting resin matrix in a B-stage state, in which the inorganic filler includes secondary sintered particles each formed of primary particles of scaly boron nitride and at least some of the secondary sintered particles each have a maximum cavity diameter of 5 μm to 80 μm.

The B-stage heat conductive sheet of this embodiment can be produced by a method which includes the step of coating a substrate with the above-mentioned thermosetting resin composition, followed by drying and the step of semi-curing the resultant dried coated film.

In this case, the substrate is not particularly limited and, for example, a known substrate such as a resin sheet or a resin film on which release treatment is applied can be used. Further, a metal sheet such as a copper foil may be used as the substrate to produce a B-stage heat conductive sheet with a metal sheet.

A method for the coating with the thermosetting resin composition is not particularly limited and a known method such as a doctor blade method can be used.

The coated thermosetting resin composition may be dried at an ambient temperature and, from the viewpoint of promoting the volatilization of the solvent, drying may be performed under heating at 80° C. to 150° C. if necessary.

A semi-cure temperature for the dried coated film has only to be set suitably depending on the kind of thermosetting resin used, and is generally 80° C. to 200° C. Further, a pre-cure time is not particularly limited, and is generally 2 minutes to 24 hours.

Further, when the dried coated film is semi-cured, pressure may be applied if necessary. Particularly when defects occur in the dried coated film owing to the drying step, pressure is preferably applied to remove the defects. The press pressure in this case is preferably 0.5 MPa to 30 MPa, more preferably 4 MPa to 20 MPa, most preferably 4 MPa to 15 MPa. If the press pressure is less than 0.5 MPa, defects in the resultant B-stage heat conductive sheet sometimes cannot be removed sufficiently. On the other hand, if the press pressure is more than 30 MPa, secondary sintered particles deform or decay, sometimes resulting in the deterioration of the heat conductivity and electrical insulation property of the resultant heat conductive sheet. Further, press time is not particularly limited and is generally 5 minutes to 60 minutes.

The B-stage heat conductive sheet of this embodiment produced as described above is excellent in adhesive property for various members such as a heat generating member and has blended therein the hollow secondary sintered particles 1, and hence, when a power module is manufactured, a defect can be caused to occur only in the large cavity 3 in each of the hollow secondary sintered particles 1 and the size of the defect can be controlled, thus allowing the suppression of the occurrence of defects in the base portion of the resultant heat conductive sheet. That is, it is possible to provide a heat conductive sheet in which electrical insulation property is kept by controlling where the defects such as voids and cracks occur and their size, and which has excellent heat conductivity.

Embodiment 3

A power module of this embodiment includes a heat conductive sheet produced from the above-mentioned thermosetting resin composition or the above-mentioned B-stage heat conductive sheet. That is, the power module of this embodiment includes a heat conductive sheet including an inorganic filler dispersed in a thermosetting resin matrix, in which the inorganic filler includes secondary sintered particles each formed of primary particles of scaly boron nitride and at least some of the secondary sintered particles each have a maximum cavity diameter of 5 μm to 80 μm.

The structure of the power module of this embodiment excluding the heat conductive sheet is not particularly limited and a known structure of a power module may be adopted.

Hereinafter, one example of the power module of this embodiment is described with reference to the drawings.

Figure 6:
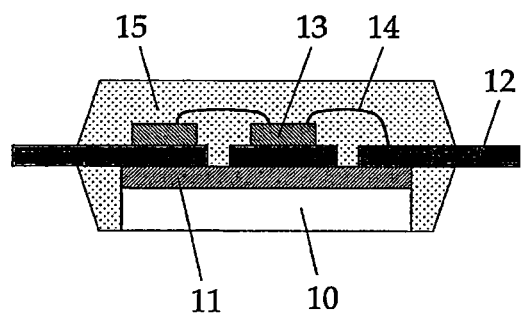
FIG. 6 A cross-sectional view of a power module of Embodiment 3.

FIG. 6 is a cross-sectional view of the power module of this Embodiment. In FIG. 6, the power module includes a heat conductive sheet 11, a heat sink 10 and a lead frame 12 sandwiching the heat conductive sheet 11, and power semiconductor devices 13 mounted on the lead frame 12. Further, metal wires 14 are used to wire-bond the power semiconductor devices 13 to each other and to wire-bond each of the power semiconductor devices 13 to the lead frame 12. In addition, a sealing resin 15 is used to seal the entire part except the terminals for external connection of the lead frame 12 and the heat dissipation part of the heat sink 10.

In this power module, all the members excluding the heat conductive sheet 11 are not particularly limited and members known in the art can be used. Note that a power semiconductor device formed of silicon can be generally used as each of the power semiconductor devices 13, but a power semiconductor device formed of a wide bandgap semiconductor having a larger bandgap compared with silicon is preferably used. Examples of the wide bandgap semiconductor include silicon carbide, a gallium nitride-based material, and diamond.

The power semiconductor device 13 formed of the wide bandgap semiconductor has a higher voltage resistance and a higher allowable current density, and hence the power semiconductor device 13 can be reduced in size. In addition, the use of the power semiconductor device 13 reduced in size as described above allows the power module in which the power semiconductor device 13 is incorporated to be reduced in size as well.

Further, the power semiconductor device 13 formed of the wide bandgap semiconductor also has a higher heat resistance, leading to reductions in the sizes of, for example, the heat sink 10, the heat conductive sheet 11, and the lead frame 12 as well. Consequently, the power module can be additionally reduced in size.

In addition, the power semiconductor device 13 formed of the wide bandgap semiconductor has a lower power loss as well, and hence more improved device efficiency can also be achieved.

Next, a production method for a power module having the above-mentioned structure is described with reference to the drawings.

Figure 7:
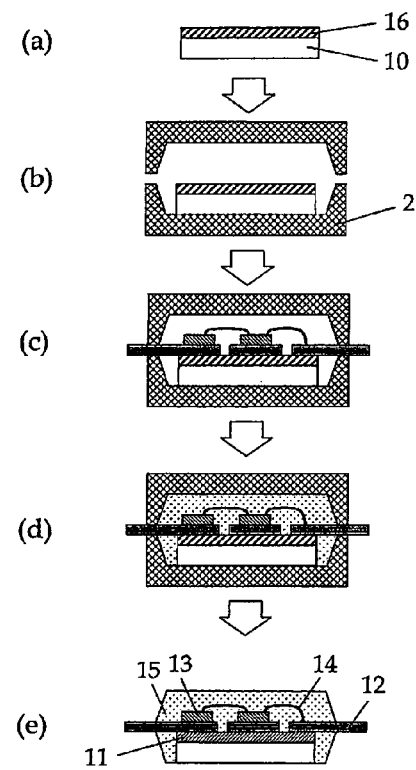
FIG. 7 A diagram for illustrating production steps of the power module of Embodiment 3.

FIG. 7 is a diagram for illustrating production steps of the power module of this embodiment. As illustrated in FIG. 7, a B-stage heat conductive sheet 16 is first formed on the heat sink 10 (step (a)). In this case, the B-stage heat conductive sheet can be directly formed on the heat sink 10 by using the thermosetting resin composition. Alternatively, it is also possible that the B-stage heat conductive sheet 16 is separately formed, and the B-stage heat conductive sheet 16 is then placed on the heat sink 10.

Next, the heat sink 10 on which the B-stage heat conductive sheet 16 is formed is placed in a mold for transfer molding 20 (step (b)).

Subsequently, a lead frame 12 mounted with the power semiconductor devices 13 and the metal wires 14 is placed on the B-stage heat conductive sheet 16 (step (c)).

Then, the sealing resin 15 is poured into the mold for transfer molding 20, followed by molding under pressure, to thereby cause the sealing resin 15 to cure (step (d)). Various conditions for the molding under pressure are not particularly limited. In general, a molding temperature is 80° C. to 250° C., preferably 150° C. to 200° C., a molding pressure is 5 MPa to 30 MPa, and a molding time is 30 seconds to 180 seconds. In the step (d), it takes a certain time until the molding pressure by the sealing resin 15 is applied to the B-stage heat conductive sheet 16, and hence the B-stage heat conductive sheet 16 is exposed to a high-temperature, pressureless state during the period until the pressure is applied. At this time, the B-stage heat conductive sheet 16 manufactured by applying pressure, in general, deforms and loosens (expands) and its thermosetting resin matrix melts and flows as well, resulting in the occurrence of defects in the base portion of the B-stage heat conductive sheet 16. However, as the B-stage heat conductive sheet 16 includes the hollow secondary sintered particles 1 each having a predetermined maximum cavity diameter, the thermosetting resin flows out from the inside of the hollow secondary sintered particles 1 having a small capillary force, thereby being able to prevent the occurrence of defects in the base portion.

Finally, the mold for transfer molding 20 is removed, thus being able to yield a power module (step (e)).

Note that the resultant power module may be subjected to post cure if necessary.

In the heat conductive sheet 11 incorporated in the power module thus produced, a defect is caused to occur only in the large cavity 3 in each of the hollow secondary sintered particles 1, thereby suppressing the occurrence of defects in the base portion of the heat conductive sheet and controlling the size of the defect in each of the hollow secondary sintered particles 1. As a result, the deterioration of the electrical insulation property in the heat conductive sheet 11 can be prevented, yielding a power module excellent in electrical insulation property and heat dissipation property. Further, as the B-stage heat conductive sheet 16 is incorporated to produce a power module, the adhesive property between the heat conductive sheet 11 and the heat sink 10 and the adhesive property between the heat conductive sheet 11 and the lead frame 12 improve, resulting in a power module excellent in reliability.

EXAMPLES

Hereinafter, the present invention is described in detail by referring to examples and comparative examples, which are not intended to limit the present invention.

The secondary sintered particles used in the examples and the comparative examples were manufactured by spray drying a slurry containing primary particles of boron nitride, a water-soluble binder, and water, followed by sintering at about 2,000° C. In this context, the maximum cavity diameter of each of the secondary sintered particles was controlled by adjusting the amount of the water in the slurry. Further, the maximum cavity diameter of each of the secondary sintered particles was obtained by manufacturing a sample in which secondary sintered particles were dispersed in an epoxy resin, polishing a cross-section of the sample, magnifying an image of the polished cross-section with a magnification of several thousand times with an electron microscope, taking several photographs of the image, and then actually measuring the maximum diameter of the cavity of each secondary sintered particle.

Example 1

Mixed were 100 parts by mass of a liquid bisphenol A-type epoxy resin (Epikote 828 manufactured by Japan Epoxy Resins Co., Ltd.), 1 part by mass of 1-cyanomethyl-2-methylimidazole (Curezol 2PN-CN manufactured by Shikoku Chemicals Corporation) serving as a curing agent, and 78 parts by mass of methyl ethyl ketone serving as a solvent. After that, secondary sintered particles and primary particles of scaly boron nitride were added as an inorganic filler to the mixture to premix the whole. In this context, the inorganic filler was added so that the content of secondary sintered particles (having an average particle diameter of 65 μm) having a maximum cavity diameter of 5 to 30 μm was 5 volume % in the resultant heat conductive sheet, the content of secondary sintered particles (having an average particle diameter of 65 μm) having a maximum cavity diameter of less than 0.1 μm was 10 volume %, and the content of primary particles (having an average length of 30 μm) of scaly boron nitride was 15 volume %. Subsequently, the premixture was kneaded by using a triple roll mill, yielding a thermosetting resin composition.

Next, a copper foil having a thickness of 105 μm was coated with the thermosetting resin composition by using a doctor blade method, followed by drying treatment under heating at 110° C. for 15 minutes, yielding a B-stage heat conductive sheet having a thickness of 200 μm.

Next, the B-stage heat conductive sheet formed on the copper foil was arranged in a mold for transfer molding, and then a lead frame mounted with power semiconductor devices and metal wires was arranged on the B-stage heat conductive sheet. Then, a sealing resin was poured into the mold for transfer molding, followed by molding under pressure. In the molding under pressure, the molding temperature was set to 180° C., the molding pressure was set to 10 MPa, and the molding time was set to 90 seconds. Subsequently, the mold for transfer molding was removed, and then the resultant molded product was subjected to post cure at 175° C. for 8 hours, yielding a power module.

Example 2

A thermosetting resin composition, a B-stage heat conductive sheet, and a power module were obtained in the same manner as in Example 1 except that the blending amount of methyl ethyl ketone was set to 125 parts by mass and that an inorganic filler was added so that the content of secondary sintered particles (having an average particle diameter of 65 μm) each having a maximum cavity diameter of 5 to 30 μm was 5 volume % in the resultant heat conductive sheet, the content of secondary sintered particles (having an average particle diameter of 65 μm) each having a maximum cavity diameter of less than 0.1 μm was 20 volume %, and the content of primary particles (having an average length of 30 μm) of scaly boron nitride was 25 volume %.

Example 3

A thermosetting resin composition, a B-stage heat conductive sheet, and a power module were obtained in the same manner as in Example 1 except that the blending amount of methyl ethyl ketone was set to 125 parts by mass and that an inorganic filler was added so that the content of secondary sintered particles (having an average particle diameter of 65 μm) each having a maximum cavity diameter of 50 to 80 μm was 5 volume % in the resultant heat conductive sheet, the content of secondary sintered particles (having an average particle diameter of 65 μm) each having a maximum cavity diameter of less than 0.1 μm was 20 volume %, and the content of primary particles (having an average length of 30 μm) of scaly boron nitride was 25 volume %.

Example 4

A thermosetting resin composition, a B-stage heat conductive sheet, and a power module were obtained in the same manner as in Example 1 except that the blending amount of methyl ethyl ketone was set to 125 parts by mass and that an inorganic filler was added so that the content of secondary sintered particles (having an average particle diameter of 65 μm) each having a maximum cavity diameter of 5 to 30 μm was 10 volume % in the resultant heat conductive sheet, the content of secondary sintered particles (having an average particle diameter of 65 μm) each having a maximum cavity diameter of less than 0.1 μm was 15 volume %, and the content of primary particles (having an average length of 30 μm) of scaly boron nitride was 25 volume %.

Example 5

A thermosetting resin composition, a B-stage heat conductive sheet, and a power module were obtained in the same manner as in Example 1 except that the blending amount of methyl ethyl ketone was set to 125 parts by mass and that an inorganic filler was added so that the content of secondary sintered particles (having an average particle diameter of 65 μm) each having a maximum cavity diameter of 5 to 30 μm was 20 volume % in the resultant heat conductive sheet, the content of secondary sintered particles (having an average particle diameter of 65 μm) each having a maximum cavity diameter of less than 0.1 μm was 5 volume %, and the content of primary particles (having an average length of 30 μm) of scaly boron nitride was 25 volume %.

Example 6

A thermosetting resin composition, a B-stage heat conductive sheet, and a power module were obtained in the same manner as in Example 1 except that the blending amount of methyl ethyl ketone was set to 234 parts by mass and that an inorganic filler was added so that the content of secondary sintered particles (having an average particle diameter of 65 μm) each having a maximum cavity diameter of 5 to 30 μm was 5 volume % in the resultant heat conductive sheet, the content of secondary sintered particles (having an average particle diameter of 65 μm) each having a maximum cavity diameter of less than 0.1 μm was 30 volume %, and the content of primary particles (having an average length of 30 μm) of scaly boron nitride was 35 volume %.

Comparative Example 1

A thermosetting resin composition, a B-stage heat conductive sheet, and a power module were obtained in the same manner as in Example 1 except that the blending amount of methyl ethyl ketone was set to 78 parts by mass and that an inorganic filler was added so that the content of secondary sintered particles (having an average particle diameter of 65 μm) each having a maximum cavity diameter of less than 0.1 μm was 15 volume % in the resultant heat conductive sheet, and the content of primary particles (having an average length of 30 μm) of scaly boron nitride was 15 volume %.

Comparative Example 2

A thermosetting resin composition, a B-stage heat conductive sheet, and a power module were obtained in the same manner as in Example 1 except that the blending amount of methyl ethyl ketone was set to 125 parts by mass and that an inorganic filler was added so that the content of secondary sintered particles (having an average particle diameter of 65 μm) each having a maximum cavity diameter of 0.1 to 1 μm was 5 volume % in the resultant heat conductive sheet, the content of secondary sintered particles (having an average particle diameter of 65 μm) each having a maximum cavity diameter of less than 0.1 μm was 20 volume %, and the content of primary particles (having an average length of 30 μm) of scaly boron nitride was 25 volume %.

Comparative Example 3

A thermosetting resin composition, a B-stage heat conductive sheet, and a power module were obtained in the same manner as in Example 1 except that the blending amount of methyl ethyl ketone was set to 125 parts by mass and that an inorganic filler was added so that the content of secondary sintered particles (having an average particle diameter of 65 μm) each having a maximum cavity diameter of 100 to 150 μm was 5 volume % in the resultant heat conductive sheet, the content of secondary sintered particles (having an average particle diameter of 65 μm) each having a maximum cavity diameter of less than 0.1 μm was 20 volume %, and the content of primary particles (having an average length of 30 μm) of scaly boron nitride was 25 volume %.

The partial discharge inception voltage and breakdown voltage of each heat conductive sheet incorporated in each of the above-mentioned power modules of Examples 1 to 6 and Comparative Examples 1 to 3 were measured to evaluate electrical insulation property. The partial discharge inception voltage was determined by measuring a voltage at which a partial discharge started by continuously applying a voltage at a constant voltage rising rate of 0.5 kV/sec to a heat conductive sheet. Further, the breakdown voltage was determined by measuring a voltage at which the insulation breakdown of a heat conductive sheet occurred by applying a voltage at a step voltage rising of every 0.5 kV to the heat conductive sheet in oil. In this context, in the evaluation of the partial discharge inception voltage, a heat conductive sheet having a partial discharge inception voltage of 3 kV or more was represented by Symbol "○", and a heat conductive sheet having a partial discharge inception voltage of less than 3 kV was represented by Symbol "×". Further, in the evaluation of the breakdown voltage, a heat conductive sheet having a breakdown voltage of 5 kV or more was represented by Symbol "○", and a heat conductive sheet having a breakdown voltage of less than 5 kV was represented by Symbol "×". Table 1 shows the results of these evaluations.

TABLE 1

| | Total content | Content (volume %) of inorganic filler in heat conductive sheet | | | | | | Evaluation of heat conductive sheet | |
|---|---|---|---|---|---|---|---|---|---|
| | | Secondary sintered particles/maximum cavity diameter | | | | | Primary particles of scaly boron nitride | Partial discharge inception voltage | Breakdown voltage |
| | | Less than 0.1 μm | 0.1 to 1 μm | 5 to 30 μm | 50 to 80 μm | 100 to 150 μm | | | |
| Example 1 | 30 | 10 | — | 5 | — | — | 15 | ○ | ○ |
| Example 2 | 50 | 20 | — | 5 | — | — | 25 | ○ | ○ |
| Example 3 | 50 | 20 | — | — | 5 | — | 25 | ○ | ○ |
| Example 4 | 50 | 15 | — | 10 | — | — | 25 | ○ | ○ |
| Example 5 | 50 | 5 | — | 20 | — | — | 25 | ○ | ○ |
| Example 6 | 70 | 30 | — | 5 | — | — | 35 | ○ | ○ |
| Comparative Example 1 | 30 | 15 | — | — | — | — | 15 | X | X |
| Comparative Example 2 | 50 | 20 | 5 | — | — | — | 25 | X | X |
| Comparative Example 3 | 50 | 20 | — | — | — | 5 | 25 | X | ○ |

As seen from the results of Table 1, the heat conductive sheet incorporated in each of the power modules of Examples 1 to 6 had both a high partial discharge inception voltage and a high breakdown voltage, thus having good electrical insulation property. A cross-section of the heat conductive sheet was observed with an electron microscope, and it was confirmed that the defects in the heat conductive sheet occurred in the cavity portion in each secondary sintered particle.

On the other hand, the heat conductive sheet incorporated in the power module of Comparative Example 1 had both a low partial discharge inception voltage and a low breakdown voltage, thus having insufficient electrical insulation property. A cross-section of the heat conductive sheet was observed with an electron microscope, and it was confirmed that a defect having a diameter of 5 μm or more occurred in the base portion and the interface portion between the base portion and each secondary sintered particle in the heat conductive sheet.

Similarly, the heat conductive sheet incorporated in the power module of Comparative Example 2 had both a low partial discharge inception voltage and a low breakdown voltage, thus having insufficient electrical insulation property. A cross-section of the heat conductive sheet was observed with an electron microscope, and it was confirmed that defects occurred in various portions such as the base portion, the interface portion between the base portion and each secondary sintered particle, and the cavity portion in each secondary sintered particle in the heat conductive sheet.

Further, the heat conductive sheet incorporated in the power module of Comparative Example 3 had a low partial discharge inception voltage, thus having insufficient electrical insulation property. A cross-section of the heat conductive sheet was observed with an electron microscope, and it was confirmed that the defects in the heat conductive sheet occurred in the cavity portion in each secondary sintered particle, but the size of each of the defects was more than 100 μm.

As seen from the results described above, according to the present invention, it is possible to provide a thermosetting resin composition and a B-stage heat conductive sheet used for producing a heat conductive sheet in which electrical insulation property is kept because the occurrence site and size of defects such as voids and cracks are controlled by blending secondary sintered particles having cavities with a particular size and which has excellent heat conductivity. In addition, according to the present invention, it is possible to provide a power module excellent in electrical insulation property and heat dissipation property by using the above-mentioned thermosetting resin composition and B-stage heat conductive sheet.

Next, the following experiments were carried out to confirm effects provided by blending a particular adhesiveness-imparting agent to a thermosetting resin composition.

The secondary sintered particles used in the experiments were manufactured by spray drying a slurry containing primary particles of boron nitride each having an average length of 3 μm, a water-soluble binder, and water, followed by firing at about 2,000° C. to cause sintering (grain growth). In this context, the average length of each of the primary particles was obtained by manufacturing a sample in which secondary sintered particles were dispersed in an epoxy resin, polishing a cross-section of the sample, magnifying an image of the polished cross-section with a magnification of several thousand times with an electron microscope, taking several photographs of the image, and then actually measuring the length of each primary particle, and averaging the measured values.

The kind and characteristics of the adhesiveness-imparting agents used in the following experiments are shown in Table 2.

TABLE 2

| | Product name | Type | Weight-average molecular weight | Glass transition temperature (° C.) |
|---|---|---|---|---|
| A-1 | JER E4275[1] | Bisphenol-type epoxy resin | 60,000 | 75 |
| A-2 | JER E4250[1] | Bisphenol-type epoxy resin | 59,000 | 78 |
| A-3 | JER E1256[1] | Bisphenol-type epoxy resin | 51,000 | 98 |
| A-4 | JER YL7290BH30[1] | Bisphenol-type epoxy resin | 44,150 | 166 |
| A-5 | Marproof G-0115S[2] | Styrene-based polymer | 11,000 | 69 |
| A-6 | Marproof G-0250S[2] | Styrene-based polymer | 20,000 | 74 |
| A-7 | Marproof G-1005S[2] | Styrene-based polymer | 100,000 | 96 |
| A-8 | JER YL7175-1000[1] | Modified bisphenol-type epoxy resin | 2,000 | <RT |
| A-9 | EXA4850-1000[3] | Modified bisphenol-type epoxy resin | 900 | <RT |

(Remark)
[1] manufactured by Japan Epoxy Resins Co., Ltd.
[2] manufactured by NOF CORPORATION
[3] manufactured by DIC Corporation

Experiment 1

19 parts by mass of an adhesiveness-imparting agent A-1 and 181 parts by mass of methyl ethyl ketone MEK (solvent) were stirred and mixed. After that, 80 parts by mass of a naphthalene-type epoxy resin (EPICLON EXA-4710: manufactured by DIC Corporation), which was solid at normal temperature, 20 parts by mass of a bisphenol A-type epoxy resin (JER 828: manufactured by Japan Epoxy Resins Co., Ltd.), which was liquid at normal temperature, and 1 part by mass of 1-cyanoethyl-2-methylimidazole (curing agent, Curezol 2PN-CN: manufactured by Shikoku Chemicals Corporation) were added, and the whole was further stirred and mixed. Subsequently, the secondary sintered particles of boron nitride manufactured as described above were added to the mixture so that the volume of the secondary sintered particles accounted for 40 volume % of the total volume of all the components excluding the solvent, and the whole was premixed. The premixture was further kneaded by using a triple roll mill, thereby yielding a thermosetting resin composition in which the secondary sintered particles of boron nitride were homogeneously dispersed.

Experiment 2

A thermosetting resin composition was obtained in the same manner as in Experiment 1 except that an adhesiveness-imparting agent A-2 was used in place of the adhesiveness-imparting agent A-1.

Experiment 3

A thermosetting resin composition was obtained in the same manner as in Experiment 1 except that an adhesiveness-imparting agent A-3 was used in place of the adhesiveness-imparting agent A-1.

Experiment 4

A thermosetting resin composition was obtained in the same manner as in Experiment 1 except that an adhesiveness-imparting agent A-5 was used in place of the adhesiveness-imparting agent A-1.

Experiment 5

A thermosetting resin composition was obtained in the same manner as in Experiment 1 except that an adhesiveness-imparting agent A-6 was used in place of the adhesiveness-imparting agent A-1.

Experiment 6

A thermosetting resin composition was obtained in the same manner as in Experiment 1 except that 5 parts by mass of the adhesiveness-imparting agent A-3 were used in place of 19 parts by mass of the adhesiveness-imparting agent A-1 and that the addition amount of methyl ethyl ketone MEK was changed to 160 parts by mass.

Experiment 7

A thermosetting resin composition was obtained in the same manner as in Experiment 1 except that 11 parts by mass of the adhesiveness-imparting agent A-3 were used in place of 19 parts by mass of the adhesiveness-imparting agent A-1 and that the addition amount of methyl ethyl ketone MEK was changed to 169 parts by mass.

Experiment 8

A thermosetting resin composition was obtained in the same manner as in Experiment 1 except that 25 parts by mass of the adhesiveness-imparting agent A-3 were used in place of 19 parts by mass of the adhesiveness-imparting agent A-1 and that the addition amount of methyl ethyl ketone MEK was changed to 190 parts by mass.

Experiment 9

A thermosetting resin composition was obtained in the same manner as in Experiment 1 except that an adhesiveness-imparting agent A-8 was used in place of the adhesiveness-imparting agent A-1.

Experiment 10

A thermosetting resin composition was obtained in the same manner as in Experiment 1 except that an adhesiveness-imparting agent A-9 was used in place of the adhesiveness-imparting agent A-1.

Experiment 11

A thermosetting resin composition was obtained in the same manner as in Experiment 1 except that the adhesiveness-imparting agent A-3 was used in place of the adhesiveness-imparting agent A-1 and that a biphenyl-type epoxy resin (YX4000: manufactured by Japan Epoxy Resins Co., Ltd.), which was solid at normal temperature, was used in place of the naphthalene-type epoxy resin (EPICLON EXA-4710: manufactured by DIC Corporation), which was solid at normal temperature.

Comparative Experiment 1

80 parts by mass of a naphthalene-type epoxy resin (EPICLON EXA-4710: manufactured by DIC Corporation), which was solid at normal temperature, 20 parts by mass of a bisphenol A-type epoxy resin (JER 828: manufactured by Japan Epoxy Resins Co., Ltd.), which was liquid at normal temperature, 1 part by mass of 1-cyanoethyl-2-methylimidazole (curing agent, Curezol 2PN-CN: manufactured by Shikoku Chemicals Corporation), and 152 parts by mass of methyl ethyl ketone MEK (solvent) were stirred and mixed. Subsequently, the secondary sintered particles of boron nitride manufactured as described above were added to the mixture so that the volume of the secondary sintered particles accounted for 40 volume % of the total volume of all the components excluding the solvent, and the whole was premixed. The premixture was further kneaded by using a triple roll mill, thereby yielding a thermosetting resin composition in which the secondary sintered particles of boron nitride were homogeneously dispersed.

Comparative Experiment 2

A thermosetting resin composition was obtained in the same manner as in Experiment 1 except that an adhesiveness-imparting agent A-4 was used in place of the adhesiveness-imparting agent A-1.

Comparative Experiment 3

A thermosetting resin composition was obtained in the same manner as in Experiment 1 except that an adhesiveness-imparting agent A-7 was used in place of the adhesiveness-imparting agent A-1.

Comparative Experiment 4

A thermosetting resin composition was obtained in the same manner as in Experiment 1 except that 3 parts by mass of the adhesiveness-imparting agent A-3 were used in place of 19 parts by mass of the adhesiveness-imparting agent A-1 and that the addition amount of methyl ethyl ketone MEK was changed to 157 parts by mass.

Comparative Experiment 5

A thermosetting resin composition was obtained in the same manner as in Experiment 1 except that 34 parts by mass of the adhesiveness-imparting agent A-3 were used in place of 19 parts by mass of the adhesiveness-imparting agent A-1 and that the addition amount of methyl ethyl ketone MEK was changed to 203 parts by mass.

A heat dissipating member having a thickness of 105 μm was coated with the thermosetting resin composition obtained in each of Experiments 1 to 11 and Comparative Experiments 1 to 5 by using a doctor blade method, followed by drying under heating at 110° C. for 15 minutes, yielding a dried coated film having a thickness of 100 μm.

Next, two heat dissipating members having formed thereon dried coated films were laminated so that each of the dried coated films was arranged on the inner side, and the whole was then heated at 120° C. for 20 minutes while being pressed at a press pressure of 5 MPa, yielding a semi-cured (B-stage) heat conductive sheet. The resultant was further heated at 160° C. for 3 hours while being pressed at a press pressure of 5 MPa, thereby completely curing the B-stage heat conductive sheet and yielding a heat conductive sheet (having a thickness of 200 μm) sandwiched by two heat dissipating members.

The coefficient of heat conductivity of the above-mentioned heat conductive sheet sandwiched by two heat dissipating members was measured in its sheet thickness direction by a laser flash method. The measurement result of the coefficient of heat conductivity was shown in Table 3 as a relative value of the coefficient of heat conductivity of each heat conductive sheet obtained in each experiment and each comparative experiment on the basis of the coefficient of heat conductivity of the heat conductive sheet obtained in Comparative Experiment 1 (value of [the coefficient of heat conductivity of each heat conductive sheet obtained in each experiment or each comparative experiment]/[the coefficient of heat conductivity of the heat conductive sheet obtained in Comparative Experiment 1]).

Further, the above-mentioned heat conductive sheet sandwiched by two heat dissipating members was evaluated for its breakdown electric field (BDE). The breakdown electric field (BDE) of the heat conductive sheet was calculated by dividing the breakdown voltage (BDV), which was measured by applying a voltage at a constant voltage rising rate of 1 kV/second to the heat conductive sheet sandwiched by two heat dissipating members in oil, by the thickness of the heat conductive sheet. The result of the breakdown electric field (BDE) was shown in Table 3 as a relative value of the BDE of the heat conductive sheet obtained in each experiment or each comparative experiment on the basis of the BDE of the heat conductive sheet obtained in Comparative Experiment 1 (value of [the BDE of the heat conductive sheet obtained in each experiment or each comparative experiment]/[the BDE of the heat conductive sheet obtained in Comparative Experiment 1]).

Next, a B-stage heat conductive sheet (having a thickness of 200 μm) was obtained in the same manner as described above except that a film on which release treatment was performed was used in place of the heat dissipating member and that the film was removed after the dried coated films were semi-cured (cured into a B-stage state). The B-stage heat conductive sheet was processed into a strip shape having a size of 10×70 mm, which was subjected to a three-point bending strength test. The measurement result of the bending strength was shown in Table 3 as a relative value of the bending strength of the heat conductive sheet obtained in each experiment or each comparative experiment on the basis of the bending strength of the heat conductive sheet obtained in Comparative Experiment 1 (value of [the bending strength of the heat conductive sheet obtained in each experiment or each comparative experiment]/[the bending strength of the heat conductive sheet obtained in Comparative Experiment 1]).

Further, a heat conductive sheet (having a thickness of 200 μm) was obtained in the same manner as described above except that a film on which release treatment was performed was used in place of the heat dissipating member and that the film was removed after the dried coated films were completely cured. The glass transition temperature of the heat conductive sheet was measured by using a dynamic viscoelasticity measuring apparatus. Table 3 shows the results.

Note that Table 3 also lists the kind and blending amount of each constituent component used in each experiment and each comparative experiment. The blending amount of the each constituent component is expressed in part(s) by mass.

TABLE 3

| | | Experiment | | | | | | | | | | | Comparative Experiment | | | | |
|---|---|---|---|---|---|---|---|---|---|---|---|---|---|---|---|---|---|
| | | 1 | 2 | 3 | 4 | 5 | 6 | 7 | 8 | 9 | 10 | 11 | 1 | 2 | 3 | 4 | 5 |
| Thermosetting resin | B-1 | 80 | 80 | 80 | 80 | 80 | 80 | 80 | 80 | 80 | 80 | | 80 | 80 | 80 | 80 | 80 |
| | B-2 | | | | | | | | | | | 80 | | | | | |
| | B-3 | 20 | 20 | 20 | 20 | 20 | 20 | 20 | 20 | 20 | 20 | 20 | 20 | 20 | 20 | 20 | 20 |
| Curing agent | Curezol 2PN-CN | 1 | 1 | 1 | 1 | 1 | 1 | 1 | 1 | 1 | 1 | 1 | 1 | 1 | 1 | 1 | 1 |
| Adhesiveness-imparting agent | A-1 | 19 | | | | | | | | | | | | | | | |
| | A-2 | | 19 | | | | | | | | | | | | | | |
| | A-3 | | | 19 | | | 5 | 11 | 25 | | 19 | | | | | 3 | 34 |
| | A-4 | | | | | | | | | | | | | 19 | | | |
| | A-5 | | | | 19 | | | | | | | | | | | | |
| | A-6 | | | | | 19 | | | | | | | | | | | |

TABLE 3-continued

| | Experiment | | | | | | | | | | | Comparative Experiment | | | | |
|---|---|---|---|---|---|---|---|---|---|---|---|---|---|---|---|---|
| | 1 | 2 | 3 | 4 | 5 | 6 | 7 | 8 | 9 | 10 | 11 | 1 | 2 | 3 | 4 | 5 |
| A-7 | | | | | | | | | | | | | 19 | | | |
| A-8 | | | | | | | | | 19 | | | | | | | |
| A-9 | | | | | | | | | | 19 | | | | | | |
| Secondary sintered particles | 151 | 151 | 151 | 151 | 151 | 134 | 141 | 159 | 151 | 151 | 151 | 127 | 151 | 151 | 131 | 170 |
| Solvent MEK | 181 | 181 | 181 | 181 | 181 | 160 | 169 | 190 | 181 | 181 | 181 | 152 | 181 | 181 | 157 | 203 |
| Heat conductivity | 1.1 | 1.1 | 1.1 | 1.1 | 1.2 | 1.0 | 1.1 | 1.1 | 1.2 | 1.2 | 1.1 | 1.0 | 0.9 | 0.8 | 1.0 | 0.9 |
| Breakdown voltage | 1.6 | 1.6 | 1.7 | 1.8 | 1.7 | 1.6 | 1.6 | 1.7 | 1.7 | 1.7 | 1.4 | 1.0 | 0.7 | 0.5 | 1.1 | 0.8 |
| Bending strength | 1.8 | 1.9 | 1.7 | 2.1 | 2.2 | 1.6 | 1.8 | 1.7 | 2.2 | 2.5 | 1.7 | 1.0 | 1.1 | 0.8 | 1.1 | 1.2 |
| Glass transition temperature (° C.) | 221 | 227 | 230 | 224 | 222 | 225 | 233 | 228 | 218 | 221 | 202 | 231 | 237 | 226 | 231 | 226 |

(Remark)
In the "Thermosetting resin" section, B-1 is EPICLON EXA-4710, B-2 is YX4000, and B-3 is JER828.

As shown in the results of Table 3, it was found that the thermosetting resin compositions (Experiments 1 to 11) in each of which a flexible resin having a weight-average molecular weight of 600 to 70,000 and a glass transition temperature of 130° C. or less was blended as an adhesiveness-imparting agent at a predetermined ratio each provided a heat conductive sheet having a high coefficient of heat conductivity and a high breakdown voltage and being excellent in heat resistance. Further, it was also found that the thermosetting resin compositions each had large bending strength in a semi-cured state (B-stage state), and hence, when a heat conductive sheet was produced, the sheet was able to be prevented from cracking and chipping.

On the other hand, the thermosetting resin composition (Comparative Experiment 1) in which no adhesiveness-imparting agent was blended, the thermosetting resin compositions (Comparative Experiments 2 and 3) in each of which a flexible resin having a weight-average molecular weight or a glass transition temperature outside a predetermined range was blended as an adhesiveness-imparting agent, and the thermosetting resin compositions (Comparative Experiments 4 and 5) in each of which the blending amount of the adhesiveness-imparting agent was not appropriate each had a sufficient heat resistance, but had any of an insufficient coefficient of heat conductivity, an insufficient breakdown voltage, and an insufficient bending strength.

Figure 8:
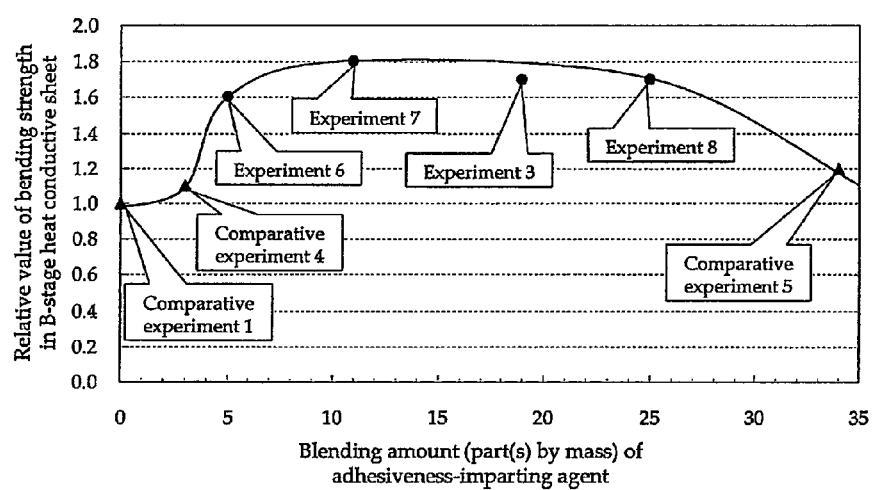
FIG. 8 A graph showing a relationship between the blending amount of an adhesiveness-imparting agent and the bending strength of each B-stage heat conductive sheet in Experiments 3 and 6 to 8 and Comparative Experiments 1, 4 and 5.

In order to examine these results in detail, FIG. 8 shows a graph showing a relationship between the blending amount of an adhesiveness-imparting agent in Experiments 3 and 6 to 8 and Comparative Experiments 1, 4, and 5 (thermosetting resin compositions different in only the blending amount of the adhesiveness-imparting agent) and the bending strength of each B-stage heat conductive sheet.

As seen from FIG. 8, when the blending amount of the adhesiveness-imparting agent is in the range of 5 parts by mass to 30 parts by mass, sufficient bending strength is provided, and hence, when a heat conductive sheet is produced (particularly when a heat conductive sheet in a B-stage state is formed and processed into a shape), the handling ease of the heat conductive sheet improves. In addition, when the blending amount of the adhesiveness-imparting agent is in this range, the resultant heat conductive sheet has a higher breakdown voltage. In contrast, when the blending amount of the adhesiveness-imparting agent is not in the range of 5 parts by mass to 30 parts by mass, satisfactory bending strength is not provided, and hence, when a heat conductive sheet is produced (particularly when a heat conductive sheet in a B-stage state is formed and processed into a shape), the heat conductive sheet may crack and chip, resulting in the deterioration of the handling ease of the heat conductive sheet. In addition, when the blending amount of an adhesiveness-imparting agent is not in this range, the resultant heat conductive sheet has a lower breakdown voltage.

In consideration of the foregoing, when an adhesiveness-imparting agent is blended in a blending amount in a predetermined range, the adhesiveness between a thermosetting resin matrix and each secondary sintered particle improves, probably resulting in the suppression of the cracking and peeling, which cause the deterioration of the electrical insulation property, of the resultant heat conductive sheet. In contrast, when an adhesiveness-imparting agent is not blended, the effect of improving the adhesiveness between a thermosetting resin matrix and each secondary sintered particle is not exerted. When the blending amount of an adhesiveness-imparting agent is small, the effect of improving the adhesiveness between a thermosetting resin matrix and each secondary sintered particle is not sufficiently exerted. When the blending amount of an adhesiveness-imparting agent is too large, when a heat conductive sheet is produced, a solvent is liable to remain in the heat conductive sheet, leading to the occurrence of voids in the sheet. As a result, the heat conductive sheet cracks and peels, probably resulting in the deterioration of its electrical insulation property. Thus, it is concluded that properly selecting the blending amount of an adhesiveness-imparting agent is important for providing desired handling ease and desired electrical insulation property.

Further, when a flexible resin having a higher weight-average molecular weight or a higher glass transition temperature is used as the adhesiveness-imparting agent (Comparative Experiments 2 and 3), sufficient bending strength is not provided, and hence, when a heat conductive sheet is produced, the heat conductive sheet may crack and chip. This is probably because the adhesiveness-imparting agent does not penetrate sufficiently into the cavities in secondary sintered particles, and hence the adhesiveness between a thermosetting resin matrix and each of the secondary sintered particles is insufficient. Further, in this case as well, the cracking and peeling of the heat conductive sheet causes the deterioration of its electrical insulation property. Thus, it is concluded that the selection of a flexible resin having a weight-average molecular weight and a glass transition temperature each in a suitable range is important for providing desired handling ease and desired electrical insulation property.

Next, a sealing resin was used to seal the heat conductive sheet produced from the thermosetting resin composition of each of Experiments 1 to 11 by a transfer molding method, thus manufacturing a power module.

In the power module, thermocouples were installed at a lead frame and the central portion of a copper heat sink, the power module was then caused to work, and the temperatures of the lead frame and the heat sink were each measured. As a result, the power module in which the heat conductive sheet produced from the thermosetting resin composition of each of Examples 1 to 11 was used had a small difference in temperature between a lead frame and a heat sink and was excellent in heat dissipation property.

As seen from the results, it is possible to provide, by blending a particular adhesiveness-imparting agent at a particular ratio, a thermosetting resin composition which can be used for producing a heat conductive sheet that can be well handled in an uncured state and in a semi-cured state and is excellent in heat resistance, heat conductivity, and electrical insulation property. Further, it is possible to provide, by using this thermosetting resin composition, a heat conductive sheet that is excellent in thermal resistance, heat conductivity, and electrical insulation property. In addition, it is possible to provide, by using this thermosetting resin composition and this heat conductive sheet, a power module that is excellent in thermal resistance and heat dissipation property.

Note that this international application claims priority based on Japanese Patent Application No. 2010-037501 filed on Feb. 23, 2010, the disclosure of which is incorporated herein by reference in its entirety.

The invention claimed is:

1. A thermosetting resin composition, comprising an inorganic filler and a thermosetting resin matrix component, wherein:
the inorganic filler comprises secondary sintered particles formed of primary particles of scaly boron nitride; and
at least some of the secondary sintered particles have a maximum cavity diameter of 5 μm to 80 μm.

2. The thermosetting resin composition according to claim 1, wherein the maximum cavity diameter of the secondary sintered particles is two thirds or less of an average particle diameter of each of the secondary sintered particles.

3. The thermosetting resin composition according to claim 1, wherein the inorganic filler further comprises primary particles of scaly boron nitride.

4. The thermosetting resin composition according to claim 1, further comprising an adhesiveness-imparting agent which is a flexible resin having a weight-average molecular weight of 600 to 70,000 and a glass transition temperature of 130° C. or less, in a range of 5 parts by mass to 30 parts by mass with respect to 100 parts by mass of the thermosetting resin matrix component.

5. The thermosetting resin composition according to claim 4, wherein the flexible resin is at least one selected from the group consisting of a bisphenol epoxy resin and a styrene-based polymer.

6. The thermosetting resin composition according to claim 5, wherein:
the flexible resin is at least one bisphenol epoxy resin represented by formula (1) or (2):

wherein:
A represents an aliphatic hydrocarbon, a bisphenol A skeleton, a bisphenol F skeleton, a bisphenol A/F mixed skeleton, a naphthalene skeleton, a biphenyl skeleton, a dicyclopentadiene skeleton, or

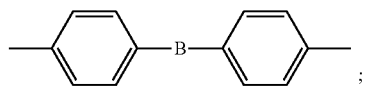

B represents $CH_2$, $CH(CH_3)$, or $C(CH_3)_2$;
X represents an ethyleneoxyethyl group, a di(ethyleneoxy)ethyl group, a tri(ethyleneoxy)ethyl group, a tetra(ethyleneoxy)ethyl group, a propyleneoxypropyl group, a di(propyleneoxy)propyl group, a tri(propyleneoxy)propyl group, a tetra(propyleneoxy)propyl group, a butyleneoxybutyl group, a di(butyleneoxy)butyl group, a tri(butyleneoxy)butyl group, a tetra(butyleneoxy)butyl group, an alkylene group having 2 to 15 carbon atoms, or an aliphatic hydrocarbon group having a cycloalkane skeleton and 6 to 17 carbon atoms;
n represents 0 to 10; and
m represents 0 to 20.

7. A B-stage heat conductive sheet, comprising an inorganic filler dispersed in a thermosetting resin matrix in a B-stage state, wherein:
the inorganic filler comprises secondary sintered particles each formed of primary particles of scaly boron nitride; and
at least some of the secondary sintered particles have a maximum cavity diameter of 5 μm to 80 μm.

8. The B-stage heat conductive sheet according to claim 7, wherein the maximum cavity diameter of the secondary sintered particles is two thirds or less of an average particle diameter of each of the secondary sintered particles.

9. The B-stage heat conductive sheet according to claim 7, wherein the inorganic filler further comprises primary particles of scaly boron nitride.

10. The B-stage heat conductive sheet according to claim 7, further comprising an adhesiveness-imparting agent which is a flexible resin having a weight-average molecular weight of 600 to 70,000 and a glass transition temperature of 130° C. or less, in a range of 5 parts by mass to 30 parts by mass with respect to 100 parts by mass of the thermosetting resin matrix.

11. The B-stage heat conductive sheet according to claim 10, wherein the flexible resin is at least one selected from the group consisting of a bisphenol epoxy resin and a styrene-based polymer.

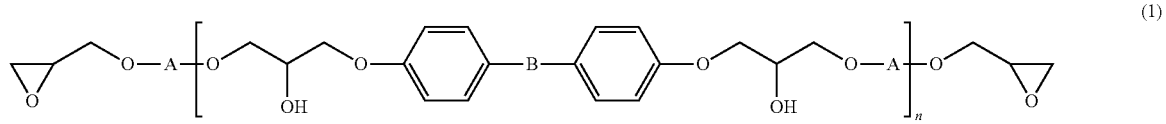

(1)

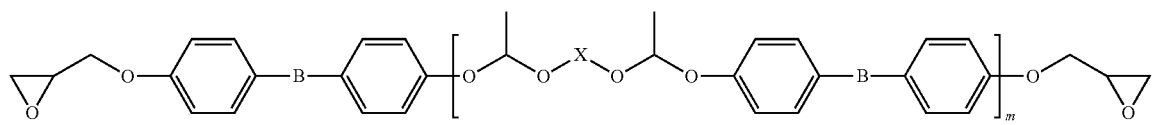

(2)

12. The B-stage heat conductive sheet according to claim 11, wherein the flexible resin is at least one bisphenol epoxy resin represented by formula (1) or (2):

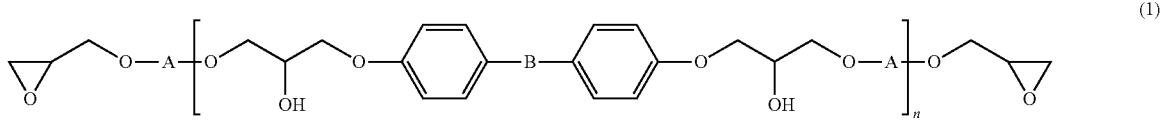

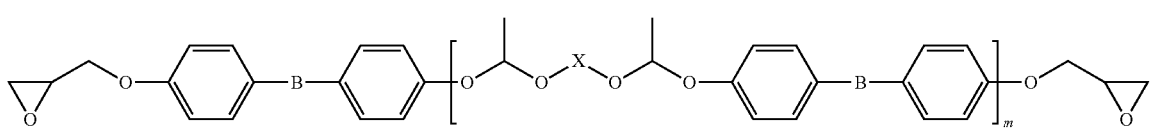

wherein:
A represents an aliphatic hydrocarbon, a bisphenol A skeleton, a bisphenol F skeleton, a bisphenol A/F mixed skeleton, a naphthalene skeleton, a biphenyl skeleton, a dicyclopentadiene skeleton, or

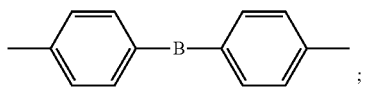

B represents $CH_2$, $CH(CH_3)$, or $C(CH_3)_2$;
X represents an ethyleneoxyethyl group, a di(ethyleneoxy)ethyl group, a tri(ethyleneoxy)ethyl group, a tetra(ethyleneoxy)ethyl group, a propyleneoxypropyl group, a di(propyleneoxy)propyl group, a tri(propyleneoxy)propyl group, a tetra(propyleneoxy)propyl group, a butyleneoxybutyl group, a di(butyleneoxy)butyl group, a tri(butyleneoxy)butyl group, a tetra(butyleneoxy)butyl group, an alkylene group having 2 to 15 carbon atoms, or an aliphatic hydrocarbon group having a cycloalkane skeleton and 6 to 17 carbon atoms;
n represents 0 to 10; and
m represents 0 to 20.

13. A power module, comprising a heat conductive sheet comprising an inorganic filler dispersed in a thermosetting resin matrix, wherein:
the inorganic filler comprises secondary sintered particles formed of primary particles of scaly boron nitride; and
at least some of the secondary sintered particles have a maximum cavity diameter of 5 μm to 80 μm.

14. The power module according to claim 13, wherein the maximum cavity diameter of the secondary sintered particles is two thirds or less of an average particle diameter of each of the secondary sintered particles.

15. The power module according to claim 13, wherein the inorganic filler further comprises primary particles of scaly boron nitride.

16. The power module according to claim 13, wherein the heat conductive sheet further comprises an adhesiveness-imparting agent which is a flexible resin having a weight-average molecular weight of 600 to 70,000 and a glass transition temperature of 130° C. or less, in a range of 5 parts by mass to 30 parts by mass with respect to 100 parts by mass of the thermosetting resin matrix.

17. The power module according to claim 16, wherein the flexible resin is at least one selected from the group consisting of a bisphenol epoxy resin and a styrene-based polymer.

18. The power module according to claim 17, wherein the flexible resin is at least one bisphenol epoxy resin represented by formula (1) or (2):

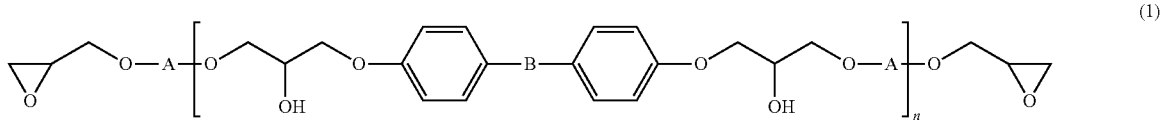

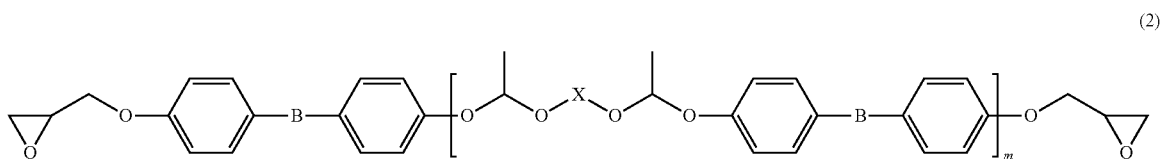

wherein:

A represents an aliphatic hydrocarbon, a bisphenol A skeleton, a bisphenol F skeleton, a bisphenol A/F mixed skeleton, a naphthalene skeleton, a biphenyl skeleton, a dicyclopentadiene skeleton, or

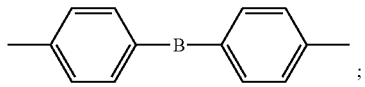
;

B represents $CH_2$, $CH(CH_3)$, or $C(CH_3)_2$;

X represents an ethyleneoxyethyl group, a di(ethyleneoxy)ethyl group, a tri(ethyleneoxy)ethyl group, a tetra(ethyleneoxy)ethyl group, a propyleneoxypropyl group, a di(propyleneoxy)propyl group, a tri(propyleneoxy)propyl group, a tetra(propyleneoxy)propyl group, a butyleneoxybutyl group, a di(butyleneoxy)butyl group, a tri(butyleneoxy)butyl group, a tetra(butyleneoxy)butyl group, an alkylene group having 2 to 15 carbon atoms, or an aliphatic hydrocarbon group having a cycloalkane skeleton and 6 to 17 carbon atoms;

n represents 0 to 10; and m represents 0 to 20.

* * * * *